US008442785B2

(12) United States Patent
Walters et al.

(10) Patent No.: US 8,442,785 B2
(45) Date of Patent: *May 14, 2013

(54) SYSTEM AND METHOD FOR STREETLIGHT MONITORING DIAGNOSTICS

(75) Inventors: Jeff Walters, Marshfield, MA (US); Michael Dorogi, Newark, OH (US); Szabolcs Zigovski, Mableton, GA (US); Voicu Cristian, Marietta, GA (US); Ion Ticus, Bucharest (RO)

(73) Assignee: ABL IP Holding LLC, Conyers, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/301,208

(22) Filed: Nov. 21, 2011

(65) Prior Publication Data

US 2012/0072138 A1    Mar. 22, 2012

Related U.S. Application Data

(63) Continuation of application No. 12/395,191, filed on Feb. 27, 2009, now Pat. No. 8,140,276.

(60) Provisional application No. 61/031,865, filed on Feb. 27, 2008.

(51) Int. Cl.
*G01R 31/00* (2006.01)
*H05B 37/00* (2006.01)

(52) U.S. Cl.
USPC ............... 702/58; 702/57; 702/59; 702/60; 702/34; 702/65; 315/134; 315/135; 315/136

(58) Field of Classification Search .............. 702/57–60, 702/64, 65; 315/134–136
See application file for complete search history.

(56) References Cited

U.S. PATENT DOCUMENTS

| 3,149,317 | A |   | 9/1964 | Brugilera et al. |
| 3,747,104 | A |   | 7/1973 | Pansini |
| 3,873,882 | A |   | 3/1975 | Gershen |
| 4,338,562 | A | * | 7/1982 | Terwilliger .................. 323/323 |

(Continued)

FOREIGN PATENT DOCUMENTS

| CA | 2419118 | 8/2003 |
| CN | 1571618 | 1/2005 |

(Continued)

OTHER PUBLICATIONS

Pickberry Vineyard: Accenture Prototype Helps Improve Crop Management, from www.accenture.com, Copyright 1996-2005, 2 pages.

(Continued)

*Primary Examiner* — Sujoy Kundu
(74) *Attorney, Agent, or Firm* — Kilpatrick Townsend & Stockton LLP

(57) ABSTRACT

One or more example diagnostics may be implemented as part of an intelligent luminaire manager or other radio frequency (RF) device that is in communication with an equipment or fixture such as a luminaire. Example diagnostics can determine a status such as a fixture malfunction, a cycling condition, a miswiring configuration, or another condition. The determined status can be wirelessly transmitted from the intelligent luminaire manager or other radio frequency device to a network server via a network. The network may be a network of intelligent luminaire managers and/or RF devices.

13 Claims, 16 Drawing Sheets

U.S. PATENT DOCUMENTS

| | | |
|---|---|---|
| 4,575,660 A | 3/1986 | Zaharchuk et al. |
| 4,691,341 A | 9/1987 | Knoble et al. |
| 4,694,223 A | 9/1987 | Campolo |
| 4,727,296 A | 2/1988 | Zaharchuk et al. |
| 4,924,151 A | 5/1990 | D'Aleo et al. |
| 4,980,806 A | 12/1990 | Taylor et al. |
| 4,988,920 A | 1/1991 | Hoeksma |
| 5,019,955 A | 5/1991 | Hoeksma |
| 5,051,727 A | 9/1991 | Fockens |
| 5,095,502 A | 3/1992 | Finzel |
| 5,187,655 A | 2/1993 | Post et al. |
| 5,191,265 A | 3/1993 | D'Aleo et al. |
| 5,209,560 A | 5/1993 | Taylor et al. |
| 5,248,919 A | 9/1993 | Hanna et al. |
| 5,329,431 A | 7/1994 | Taylor et al. |
| 5,357,170 A | 10/1994 | Luchaco et al. |
| 5,399,940 A | 3/1995 | Hanna et al. |
| 5,430,356 A | 7/1995 | Ference et al. |
| 5,452,294 A | 9/1995 | Natarajan |
| 5,463,286 A | 10/1995 | D'Aleo et al. |
| 5,473,202 A | 12/1995 | Mudge et al. |
| 5,479,159 A | 12/1995 | Kelly et al. |
| 5,487,088 A | 1/1996 | Weltz et al. |
| 5,498,931 A | 3/1996 | Bedocs |
| 5,506,715 A | 4/1996 | Zhu |
| 5,530,322 A | 6/1996 | Ference et al. |
| 5,565,855 A | 10/1996 | Knibbe |
| 5,623,256 A | 4/1997 | Marcoux |
| 5,637,964 A | 6/1997 | Hakkarainen et al. |
| 5,648,656 A | 7/1997 | Begemann et al. |
| 5,652,751 A | 7/1997 | Sharony |
| 5,654,968 A | 8/1997 | Smiroldo |
| 5,668,446 A | 9/1997 | Baker |
| 5,668,537 A | 9/1997 | Chansky et al. |
| 5,699,243 A | 12/1997 | Eckel et al. |
| 5,701,117 A | 12/1997 | Platner et al. |
| 5,721,471 A | 2/1998 | Begemann et al. |
| 5,726,644 A * | 3/1998 | Jednacz et al. ............... 340/9.14 |
| 5,769,527 A | 6/1998 | Taylor et al. |
| 5,770,928 A | 6/1998 | Chansky et al. |
| 5,798,581 A | 8/1998 | Keagy et al. |
| 5,805,593 A | 9/1998 | Busche |
| 5,808,417 A | 9/1998 | Ference et al. |
| 5,811,785 A | 9/1998 | Heiman et al. |
| 5,811,942 A | 9/1998 | Pedretti |
| 5,812,422 A | 9/1998 | Lyons |
| 5,861,717 A | 1/1999 | Begemann et al. |
| 5,864,184 A | 1/1999 | Platner et al. |
| 5,874,903 A | 2/1999 | Shuey et al. |
| 5,884,181 A | 3/1999 | Arnold et al. |
| 5,886,423 A | 3/1999 | Gershen et al. |
| 5,898,384 A | 4/1999 | Alt et al. |
| 5,905,442 A | 5/1999 | Mosebrook et al. |
| 5,909,087 A | 6/1999 | Bryde et al. |
| 5,919,239 A | 7/1999 | Fraker et al. |
| 5,959,275 A | 9/1999 | Hughes et al. |
| 5,959,549 A | 9/1999 | Synesiou et al. |
| 5,962,989 A | 10/1999 | Baker |
| 5,962,991 A | 10/1999 | Levy |
| 5,962,992 A | 10/1999 | Huang et al. |
| 5,963,546 A | 10/1999 | Shoji |
| 5,971,597 A | 10/1999 | Baldwin et al. |
| 5,978,364 A | 11/1999 | Melnik |
| 5,986,574 A | 11/1999 | Colton |
| 5,990,635 A | 11/1999 | Ference et al. |
| 6,016,038 A | 1/2000 | Mueller et al. |
| 6,028,396 A | 2/2000 | Morrissey, Jr. et al. |
| 6,028,853 A | 2/2000 | Haartsen |
| 6,035,266 A | 3/2000 | Williams et al. |
| 6,037,721 A | 3/2000 | Lansing et al. |
| 6,044,062 A | 3/2000 | Brownrigg et al. |
| 6,046,550 A | 4/2000 | Ference et al. |
| 6,046,992 A | 4/2000 | Meier et al. |
| 6,078,251 A | 6/2000 | Landt et al. |
| 6,119,076 A | 9/2000 | Williams et al. |
| 6,124,806 A | 9/2000 | Cunningham et al. |
| 6,130,881 A | 10/2000 | Stiller et al. |
| 6,157,943 A | 12/2000 | Meyer |
| 6,160,359 A | 12/2000 | Fleischmann |
| 6,169,377 B1 | 1/2001 | Bryde et al. |
| 6,172,468 B1 | 1/2001 | Hollander |
| 6,174,073 B1 | 1/2001 | Regan et al. |
| 6,181,086 B1 | 1/2001 | Katyl et al. |
| 6,188,181 B1 | 2/2001 | Sinha et al. |
| 6,192,053 B1 | 2/2001 | Angelico et al. |
| 6,195,018 B1 | 2/2001 | Ragle et al. |
| 6,215,398 B1 | 4/2001 | Platner et al. |
| 6,239,722 B1 | 5/2001 | Colton et al. |
| 6,249,516 B1 | 6/2001 | Brownrigg et al. |
| 6,275,707 B1 | 8/2001 | Reed et al. |
| 6,285,912 B1 | 9/2001 | Ellison et al. |
| 6,300,727 B1 | 10/2001 | Bryde et al. |
| 6,301,257 B1 | 10/2001 | Johnson et al. |
| 6,304,180 B1 | 10/2001 | Platner et al. |
| 6,304,556 B1 | 10/2001 | Haas |
| 6,310,440 B1 | 10/2001 | Lansing et al. |
| 6,316,889 B1 | 11/2001 | Chansky et al. |
| 6,333,605 B1 | 12/2001 | Grouev et al. |
| 6,340,864 B1 | 1/2002 | Wacyk |
| 6,349,091 B1 | 2/2002 | Li |
| 6,369,704 B2 | 4/2002 | Hilleary |
| 6,370,489 B1 | 4/2002 | Williams et al. |
| 6,373,399 B1 | 4/2002 | Johnson et al. |
| 6,377,001 B1 | 4/2002 | Levy |
| 6,380,696 B1 | 4/2002 | Sembhi et al. |
| 6,388,396 B1 | 5/2002 | Katyl et al. |
| 6,388,399 B1 | 5/2002 | Eckel et al. |
| 6,392,368 B1 | 5/2002 | Deller et al. |
| 6,393,381 B1 | 5/2002 | Williams et al. |
| 6,396,216 B1 | 5/2002 | Noone et al. |
| 6,415,245 B2 | 7/2002 | William et al. |
| 6,424,270 B1 | 7/2002 | Ali |
| 6,437,692 B1 | 8/2002 | Petite et al. |
| 6,441,565 B1 | 8/2002 | Levy |
| 6,452,339 B1 | 9/2002 | Morrissey et al. |
| 6,453,687 B2 | 9/2002 | Sharood et al. |
| 6,456,960 B1 | 9/2002 | Williams et al. |
| 6,462,654 B1 | 10/2002 | Sandelman et al. |
| 6,496,012 B1 | 12/2002 | Weng et al. |
| 6,499,114 B1 | 12/2002 | Almstead et al. |
| 6,507,158 B1 | 1/2003 | Wang |
| 6,509,828 B2 | 1/2003 | Bolavage et al. |
| 6,509,841 B1 | 1/2003 | Colton et al. |
| 6,512,455 B2 | 1/2003 | Finn et al. |
| 6,528,954 B1 | 3/2003 | Lys et al. |
| 6,535,498 B1 | 3/2003 | Larsson et al. |
| 6,545,434 B2 | 4/2003 | Sembhi et al. |
| 6,548,967 B1 | 4/2003 | Dowling et al. |
| 6,552,525 B2 | 4/2003 | Bessler |
| 6,553,020 B1 | 4/2003 | Hughes et al. |
| 6,574,227 B1 | 6/2003 | Rosenberg et al. |
| 6,581,837 B1 | 6/2003 | Hattersley |
| 6,587,046 B2 | 7/2003 | Joao |
| 6,603,276 B2 | 8/2003 | Chansky et al. |
| 6,604,062 B2 | 8/2003 | Williams et al. |
| 6,608,453 B2 | 8/2003 | Morgan et al. |
| 6,614,013 B2 | 9/2003 | Pitigoi-Aron et al. |
| 6,617,560 B2 | 9/2003 | Forke |
| 6,633,823 B2 | 10/2003 | Bartone et al. |
| 6,636,005 B2 | 10/2003 | Wacyk et al. |
| 6,640,087 B2 | 10/2003 | Reed et al. |
| 6,640,253 B2 | 10/2003 | Schaefer |
| 6,667,578 B2 | 12/2003 | Lansing et al. |
| 6,704,283 B1 | 3/2004 | Stiller et al. |
| 6,714,895 B2 | 3/2004 | Williams et al. |
| 6,717,376 B2 | 4/2004 | Lys et al. |
| 6,717,660 B1 | 4/2004 | Bernardo |
| 6,724,159 B2 | 4/2004 | Gutta et al. |
| 6,731,079 B2 | 5/2004 | Andersen |
| 6,734,642 B1 | 5/2004 | Reverberi |
| 6,744,740 B2 | 6/2004 | Chen |
| 6,744,766 B2 | 6/2004 | Alapuranen |
| 6,744,771 B1 | 6/2004 | Barber et al. |
| 6,751,455 B1 | 6/2004 | Acampora |
| 6,754,192 B2 | 6/2004 | Kennedy |
| 6,757,268 B1 | 6/2004 | Zendle |
| 6,771,666 B2 | 8/2004 | Barker, Jr. |

| | | | | | |
|---|---|---|---|---|---|
| 6,774,584 B2 | 8/2004 | Lys et al. | 2001/0034793 A1 | 10/2001 | Madruga et al. |
| 6,777,891 B2 | 8/2004 | Lys et al. | 2001/0038343 A1 | 11/2001 | Meyer et al. |
| 6,781,329 B2 | 8/2004 | Mueller et al. | 2001/0040805 A1 | 11/2001 | Lansing et al. |
| 6,794,830 B2 | 9/2004 | Lansing et al. | 2002/0002444 A1 | 1/2002 | Williams et al. |
| 6,803,728 B2 | 10/2004 | Balasubramaniam et al. | 2002/0008621 A1 | 1/2002 | Barritz et al. |
| 6,806,813 B1 | 10/2004 | Cheng et al. | 2002/0009975 A1 | 1/2002 | Janusz et al. |
| 6,807,165 B2 | 10/2004 | Belcea | 2002/0013679 A1 | 1/2002 | Petite |
| 6,807,516 B2 | 10/2004 | Williams et al. | 2002/0013856 A1 | 1/2002 | Garcia-Luna-Aceves et al. |
| 6,808,279 B2 | 10/2004 | Greiner | 2002/0016767 A1 | 2/2002 | Johnston |
| 6,836,737 B2 | 12/2004 | Petite et al. | 2002/0044549 A1 | 4/2002 | Johansson et al. |
| 6,841,944 B2 | 1/2005 | Morrissey et al. | 2002/0060530 A1 | 5/2002 | Sembhi et al. |
| 6,842,668 B2 | 1/2005 | Carson et al. | 2002/0067284 A1 | 6/2002 | Chamberlain et al. |
| 6,845,274 B2 | 1/2005 | Wang | 2002/0074559 A1 | 6/2002 | Dowling et al. |
| 6,850,502 B1 | 2/2005 | Kagan et al. | 2002/0091653 A1 | 7/2002 | Peevey |
| 6,859,644 B2 | 2/2005 | Wang | 2002/0101184 A1 | 8/2002 | Chansky et al. |
| 6,867,707 B1 | 3/2005 | Kelley et al. | 2002/0130627 A1 | 9/2002 | Morgan et al. |
| 6,869,204 B2 | 3/2005 | Morgan et al. | 2002/0143482 A1 | 10/2002 | Karanam et al. |
| 6,870,846 B2 | 3/2005 | Cain | 2002/0152045 A1 | 10/2002 | Dowling et al. |
| 6,879,574 B2 | 4/2005 | Naghian et al. | 2002/0154025 A1 | 10/2002 | Ling |
| 6,888,322 B2 | 5/2005 | Dowling et al. | 2002/0161556 A1 | 10/2002 | Williams et al. |
| 6,892,168 B2 | 5/2005 | Williams et al. | 2002/0176396 A1 | 11/2002 | Hammel et al. |
| 6,897,624 B2 | 5/2005 | Lys et al. | 2002/0178047 A1 | 11/2002 | Or et al. |
| 6,917,985 B2 | 7/2005 | Madruga et al. | 2002/0181427 A1 | 12/2002 | Sparr et al. |
| 6,927,547 B2 | 8/2005 | Walko, Jr. et al. | 2002/0193969 A1 | 12/2002 | Frantz et al. |
| 6,930,455 B2 | 8/2005 | Chansky et al. | 2003/0020595 A1 | 1/2003 | Wacyk |
| 6,933,486 B2 | 8/2005 | Pitigoi-Aron et al. | 2003/0057884 A1 | 3/2003 | Dowling et al. |
| 6,933,685 B2 | 8/2005 | Gutta et al. | 2003/0061159 A1 | 3/2003 | Adams et al. |
| 6,936,978 B2 | 8/2005 | Morgan et al. | 2003/0076281 A1 | 4/2003 | Morgan et al. |
| 6,937,985 B2 | 8/2005 | Kuma | 2003/0076417 A1 | 4/2003 | Thomas et al. |
| 6,944,131 B2 | 9/2005 | Beshai et al. | 2003/0085749 A1 | 5/2003 | Xu et al. |
| 6,963,285 B2 | 11/2005 | Fischer et al. | 2003/0101108 A1 | 5/2003 | Botham et al. |
| 6,965,205 B2 | 11/2005 | Piepgras et al. | 2003/0128134 A1 | 7/2003 | Fierro et al. |
| 6,965,568 B1 | 11/2005 | Larsen | 2003/0137968 A1 | 7/2003 | Lareau et al. |
| 6,965,575 B2 | 11/2005 | Srikrishna et al. | 2003/0198188 A1 | 10/2003 | Castlebury et al. |
| 6,967,448 B2 | 11/2005 | Morgan et al. | 2003/0222587 A1 | 12/2003 | Dowling, Jr. et al. |
| 6,969,954 B2 | 11/2005 | Lys | 2004/0001442 A1 | 1/2004 | Rayment et al. |
| 6,970,444 B2 | 11/2005 | Chwieseni et al. | 2004/0032226 A1 | 2/2004 | Lys |
| 6,975,079 B2 | 12/2005 | Lys et al. | 2004/0051467 A1 | 3/2004 | Balasubramaniam et al. |
| 6,977,937 B1 | 12/2005 | Weinstein et al. | 2004/0051485 A1 | 3/2004 | Chansky et al. |
| 6,980,537 B1 | 12/2005 | Liu | 2004/0052076 A1 | 3/2004 | Mueller et al. |
| 6,982,982 B1 | 1/2006 | Barker, Jr. et al. | 2004/0062224 A1 | 4/2004 | Brownrigg et al. |
| 6,993,325 B1 | 1/2006 | Waesterlid | 2004/0068549 A1 | 4/2004 | Motoyama |
| 7,012,520 B2 | 3/2006 | Webb, Sr. | 2004/0099736 A1 | 5/2004 | Neumark |
| 7,012,546 B1 | 3/2006 | Zigdon et al. | 2004/0119415 A1 | 6/2004 | Lansing et al. |
| 7,027,808 B2 | 4/2006 | Wesby | 2004/0124786 A1 | 7/2004 | Morrissey, Jr. et al. |
| 7,031,920 B2 | 4/2006 | Dowling et al. | 2004/0136194 A1 | 7/2004 | Disalvo |
| 7,046,149 B1 | 5/2006 | Badenhop et al. | 2004/0138786 A1 | 7/2004 | Blackett et al. |
| 7,050,808 B2 | 5/2006 | Janusz et al. | 2004/0151129 A1 | 8/2004 | Kun-Szabo et al. |
| 7,064,498 B2 | 6/2006 | Dowling et al. | 2004/0162902 A1 | 8/2004 | Davis |
| 7,071,634 B2 | 7/2006 | Johnson et al. | 2004/0177032 A1 | 9/2004 | Bradley et al. |
| 7,075,254 B2 | 7/2006 | Chitta et al. | 2004/0178257 A1 | 9/2004 | Jeffery |
| 7,084,581 B2 | 8/2006 | Honma et al. | 2004/0181496 A1 | 9/2004 | Odinotski et al. |
| 7,109,668 B2 | 9/2006 | Pogodayev et al. | 2004/0212993 A1 | 10/2004 | Morgan et al. |
| 7,113,541 B1 | 9/2006 | Lys et al. | 2004/0232856 A1 | 11/2004 | Huber |
| 7,119,676 B1 | 10/2006 | Silverstrim et al. | 2004/0248578 A1 | 12/2004 | Korpela et al. |
| 7,122,976 B1 | 10/2006 | Null et al. | 2004/0252643 A1 | 12/2004 | Joshi |
| 7,126,291 B2 | 10/2006 | Kruse et al. | 2005/0029955 A1 | 2/2005 | Blake |
| 7,135,824 B2 | 11/2006 | Lys et al. | 2005/0035717 A1 | 2/2005 | Adamson et al. |
| 7,135,956 B2 | 11/2006 | Bartone et al. | 2005/0035720 A1 | 2/2005 | Blake |
| 7,148,800 B2 | 12/2006 | Cunningham et al. | 2005/0040809 A1 | 2/2005 | Uber, III et al. |
| 7,161,213 B2 | 1/2007 | Ito et al. | 2005/0041161 A1 | 2/2005 | Dowling et al. |
| 7,164,110 B2 | 1/2007 | Pitigoi-Aron et al. | 2005/0047134 A1 | 3/2005 | Mueller et al. |
| 7,166,970 B2 | 1/2007 | Johnson et al. | 2005/0054292 A1 | 3/2005 | Janusz et al. |
| 7,167,777 B2 | 1/2007 | Budike, Jr. | 2005/0067982 A1 | 3/2005 | Pilz |
| 7,170,238 B2 | 1/2007 | Adamson et al. | 2005/0075104 A1 | 4/2005 | Jain et al. |
| 7,172,328 B2 | 2/2007 | Hoelen et al. | 2005/0076034 A1 | 4/2005 | Addonisio et al. |
| 7,180,251 B2 | 2/2007 | van Eerden | 2005/0094493 A1 | 5/2005 | Walko, Jr. |
| 7,184,905 B2 | 2/2007 | Stefan | 2005/0102040 A1 | 5/2005 | Kruse et al. |
| 7,186,003 B2 | 3/2007 | Dowling et al. | 2005/0124346 A1 | 6/2005 | Corbett et al. |
| 7,187,141 B2 | 3/2007 | Mueller et al. | 2005/0128666 A1 | 6/2005 | Pogodayev et al. |
| 7,190,124 B2 | 3/2007 | Kumar et al. | 2005/0136834 A1 | 6/2005 | Bonta et al. |
| 7,190,125 B2 | 3/2007 | McDonough et al. | 2005/0145688 A1 | 7/2005 | Milenkovic et al. |
| 7,211,968 B2 | 5/2007 | Adamson et | 2005/0146284 A1 | 7/2005 | Honma et al. |
| 7,231,060 B2 | 6/2007 | Dowling et al. | 2005/0146288 A1 | 7/2005 | Johnson et al. |
| 7,242,152 B2 | 7/2007 | Dowling et al. | 2005/0149345 A1 | 7/2005 | Daily |
| 7,248,239 B2 | 7/2007 | Dowling et al. | 2005/0161511 A1 | 7/2005 | Parker et al. |
| 7,253,566 B2 | 8/2007 | Lys et al. | 2005/0163101 A1 | 7/2005 | Ashwood Smith et al. |
| 8,140,276 B2 * | 3/2012 | Walters et al. ............ 702/58 | 2005/0163144 A1 | 7/2005 | Srikrishna et al. |
| 2001/0005368 A1 | 6/2001 | Rune | 2005/0164630 A1 | 7/2005 | Kates |

| | | |
|---|---|---|
| 2005/0184671 A1 | 8/2005 | Williams et al. |
| 2005/0207159 A1 | 9/2005 | Maxik |
| 2005/0213350 A1 | 9/2005 | Tsuda et al. |
| 2005/0225441 A1 | 10/2005 | Kernan |
| 2005/0232289 A1 | 10/2005 | Walko, Jr. et al. |
| 2005/0236998 A1 | 10/2005 | Mueller et al. |
| 2005/0242181 A1 | 11/2005 | Cunningham et al. |
| 2005/0248300 A1 | 11/2005 | Walko, Jr. et al. |
| 2005/0249215 A1 | 11/2005 | Kelsey et al. |
| 2005/0259647 A1 | 11/2005 | Wakumoto et al. |
| 2005/0271006 A1 | 12/2005 | Chari et al. |
| 2005/0275532 A1 | 12/2005 | Ferri et al. |
| 2005/0276233 A1 | 12/2005 | Shepard et al. |
| 2005/0277443 A1 | 12/2005 | Ozluturk |
| 2005/0280555 A1 | 12/2005 | Warner, IV |
| 2005/0282494 A1 | 12/2005 | Kossi et al. |
| 2005/0286426 A1 | 12/2005 | Padhye et al. |
| 2006/0002368 A1 | 1/2006 | Budampati et al. |
| 2006/0020498 A1 | 1/2006 | Aitipamula et al. |
| 2006/0038672 A1 | 2/2006 | Schoettle |
| 2006/0044152 A1 | 3/2006 | Wang |
| 2006/0049935 A1 | 3/2006 | Giannopoulos et al. |
| 2006/0058925 A1 | 3/2006 | Diederiks et al. |
| 2006/0071605 A1 | 4/2006 | Diederiks |
| 2006/0108950 A1 | 5/2006 | Chansky et al. |
| 2006/0125426 A1 | 6/2006 | Veskovic et al. |
| 2006/0144920 A1 | 7/2006 | Fang et al. |
| 2006/0202851 A1 | 9/2006 | Cash et al. |
| 2006/0235611 A1 | 10/2006 | Deaton et al. |
| 2006/0242200 A1 | 10/2006 | Horowitz et al. |
| 2006/0244395 A1 | 11/2006 | Taipale et al. |
| 2006/0244631 A1 | 11/2006 | Zigdon et al. |
| 2006/0273970 A1 | 12/2006 | Mosebrook et al. |
| 2006/0279236 A1 | 12/2006 | Johnson et al. |
| 2006/0284734 A1 | 12/2006 | Newman, Jr. |
| 2007/0013489 A1 | 1/2007 | Bechtle et al. |
| 2007/0018783 A1 | 1/2007 | Erhardt |
| 2007/0029949 A1 | 2/2007 | Null et al. |
| 2007/0032990 A1 | 2/2007 | Williams et al. |
| 2007/0043540 A1 | 2/2007 | Cleland et al. |
| 2007/0046489 A1 | 3/2007 | Fair et al. |
| 2007/0049242 A1 | 3/2007 | Fair et al. |
| 2007/0057807 A1 | 3/2007 | Walters et al. |
| 2007/0061020 A1 | 3/2007 | Bovee et al. |
| 2007/0063866 A1 | 3/2007 | Webb |
| 2007/0085700 A1 | 4/2007 | Walters et al. |
| 2007/0085701 A1 | 4/2007 | Walters et al. |
| 2007/0085702 A1 | 4/2007 | Walters et al. |
| 2007/0086912 A1 | 4/2007 | Dowling et al. |
| 2007/0091623 A1 | 4/2007 | Walters et al. |
| 2007/0103324 A1 | 5/2007 | Kosuge et al. |
| 2007/0109142 A1 | 5/2007 | McCollough, Jr. |
| 2007/0121323 A1 | 5/2007 | Pawlik et al. |
| 2007/0124074 A1 | 5/2007 | Katoh et al. |
| 2007/0124077 A1 | 5/2007 | Hedlund, Jr. |
| 2007/0126368 A1 | 6/2007 | McDonough et al. |
| 2007/0146126 A1 | 6/2007 | Wang |
| 2007/0194722 A1 | 8/2007 | Bruekers et al. |
| 2007/0195526 A1 | 8/2007 | Dowling et al. |
| 2007/0230159 A1 | 10/2007 | Cortenraad et al. |

FOREIGN PATENT DOCUMENTS

| | | |
|---|---|---|
| CN | 1596053 | 3/2005 |
| EP | 0586322 | 3/1994 |
| EP | 0880308 A2 | 11/1998 |
| EP | 1239704 | 9/2002 |
| EP | 1241924 | 9/2002 |
| EP | 1339155 | 8/2003 |
| EP | 0880308 B1 | 9/2003 |
| EP | 1742321 | 1/2007 |
| ES | 2116211 | 7/1998 |
| FR | 2601485 | 1/1988 |
| FR | 2710205 | 3/1995 |
| FR | 2815744 | 4/2002 |
| GB | 2368905 | 5/2002 |
| GB | 2372160 | 8/2002 |
| GB | 2403357 | 12/2004 |
| JP | 11283760 | 10/1999 |
| KR | 20050003165 | 1/2005 |
| WO | 9620369 | 7/1996 |
| WO | 9636202 | 11/1996 |
| WO | 9802859 | 1/1998 |
| WO | 0076034 | 12/2000 |
| WO | 0211098 | 2/2002 |
| WO | 03034570 | 4/2003 |

OTHER PUBLICATIONS

Products, from www.telemics.com/products_valueproposition.php, printed Nov. 21, 2005, 1 page.

Solution Brief: Wireless Mesh Network, Nortel Networks Brochure, Copyright 2005, 6 pages.

StreetSmarts™, Remote monitoring and control of street lights, GE Lighting Systems Brochure, Copyright 2003, 8 pages.

Technology, from www.telemics.com/technology.php, printed Nov. 21, 2005, 1 page.

UtiliNet Series 3000 WanGate Radios: Spread Spectrum Mesh Radios, Cellnet, undated, 2 pages.

Verics™ AccessPoint Data Sheet, Telemics, Apr. 2004, 1 page.

Verics™ CheckPoint Data Sheet, Telemics, Apr. 2004, 1 page.

"BelAir200: Wireless Multi-Service Switch Router for Hot Zone and Metro Wi-Fi Applications," BelAir Networks Brochure, Nov. 2005, 4 pages.

Ezendam, "Nedap News Release: Net profits increase to €6.3 million during the first six months of 2007," http://www.nedap.com/en/new.php?id=58, Aug. 2003, 5 pages.

Garris, "DALI Explained: Deciphering the DALI Hype," http://www.buildings.com/functions/print_article.aspx?contentID=1463, Aug. 2003, 5 pages.

\* cited by examiner

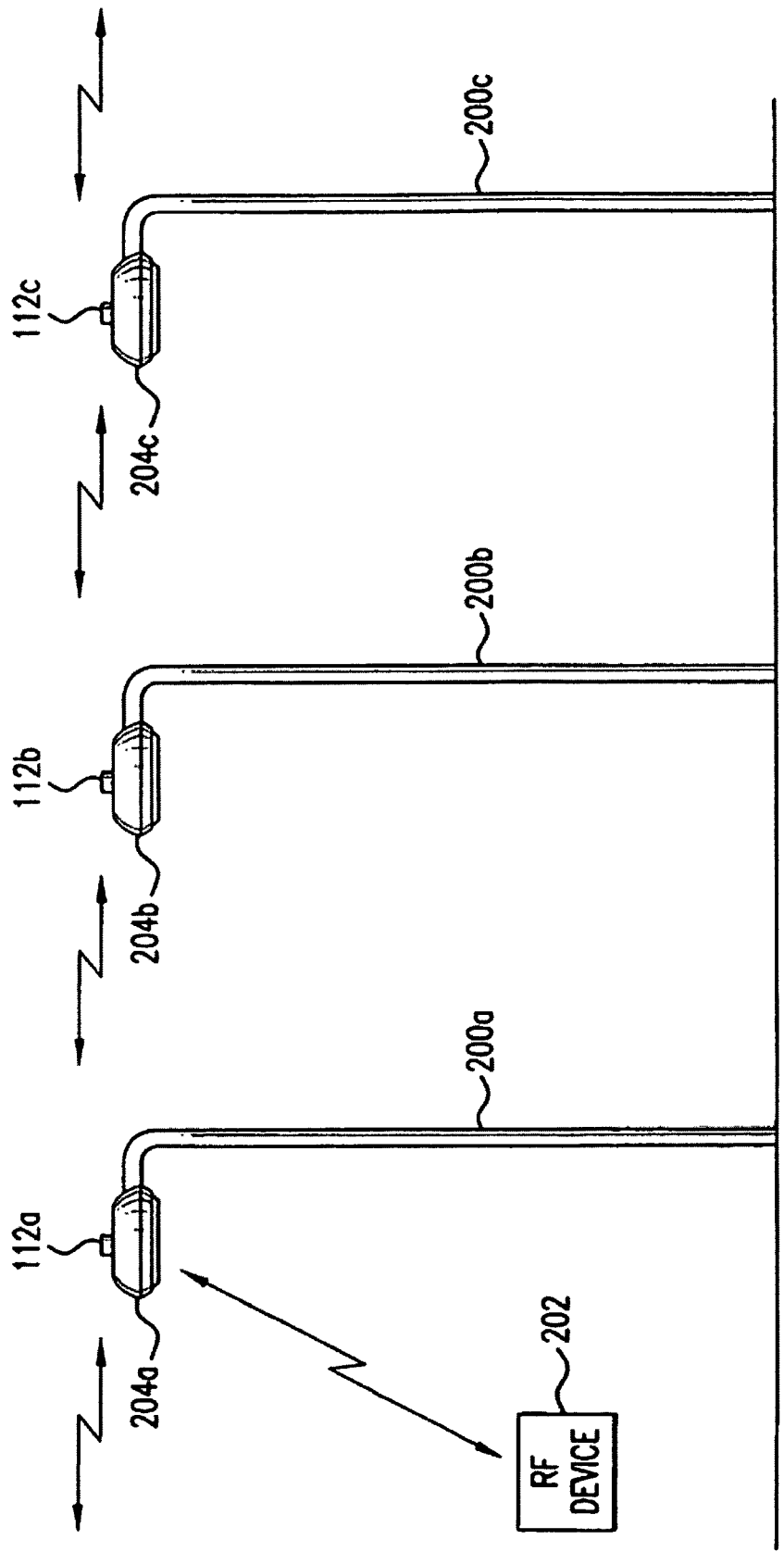

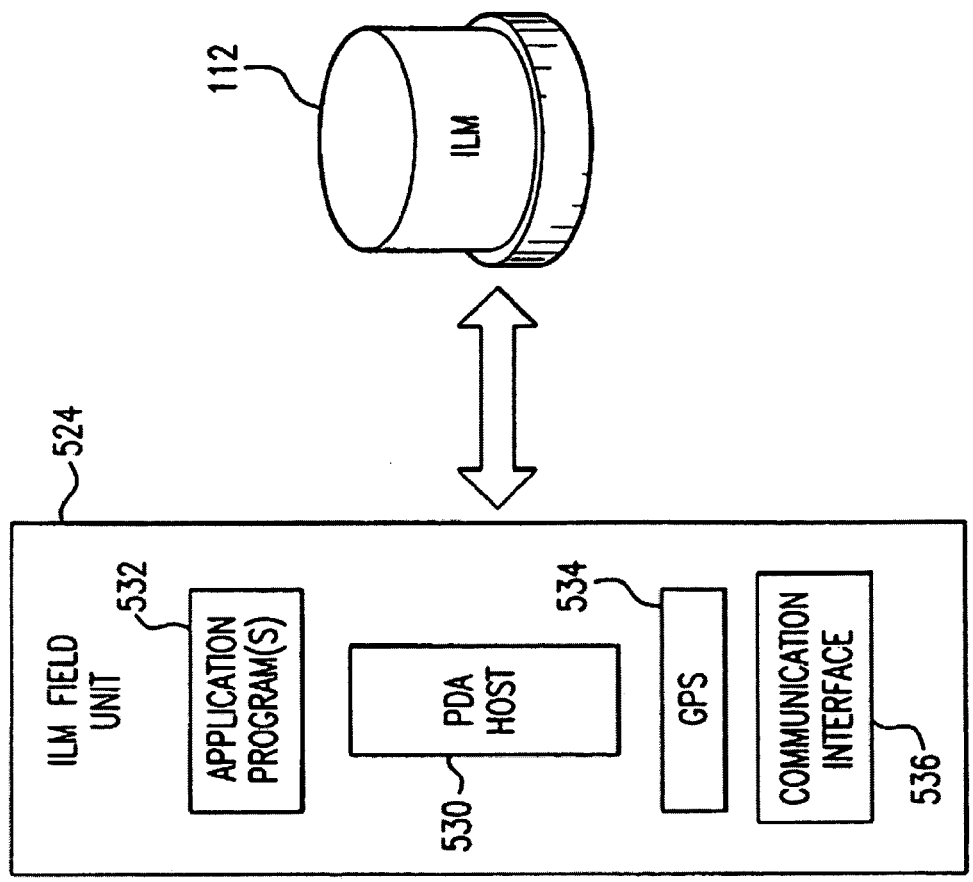
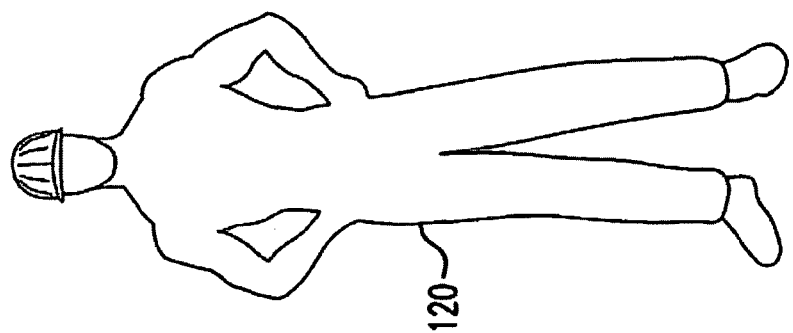
FIG. 5B

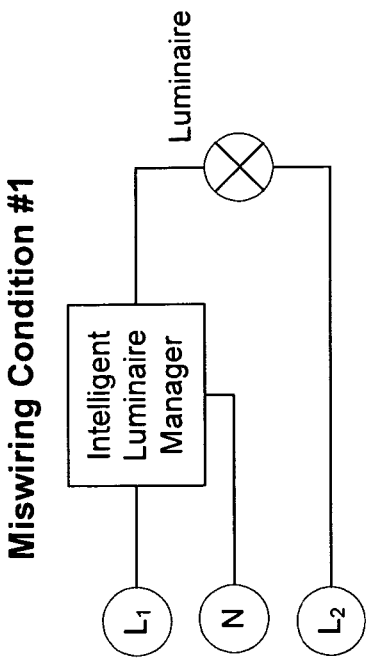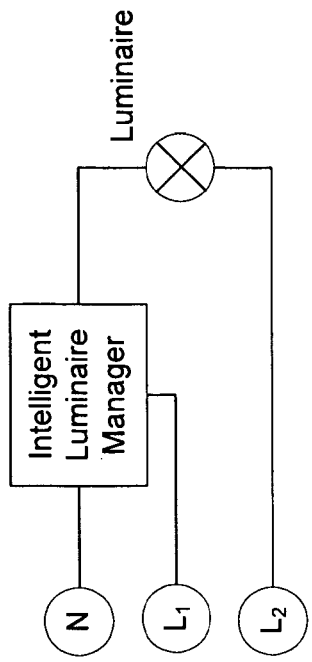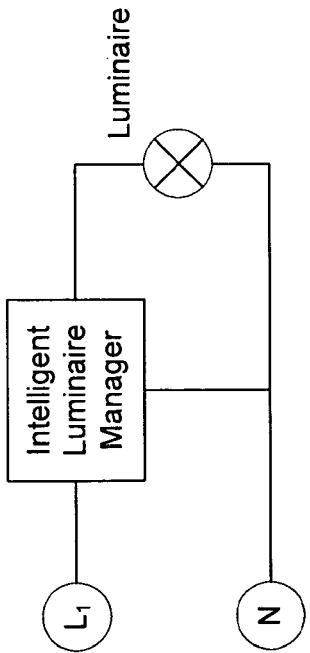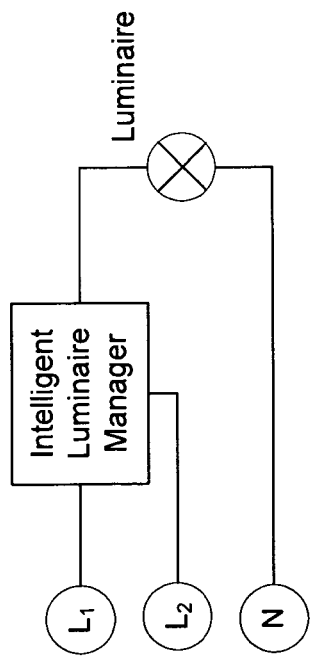
FIG. 8B

SYSTEM AND METHOD FOR STREETLIGHT MONITORING DIAGNOSTICS

RELATED APPLICATION

The present application is a continuation of U.S. patent application Ser. No. 12/385,191, now issued U.S. Pat. No. 8,140,276, filed on Feb. 27, 2009, which claims priority to U.S. Provisional Application Ser. No. 61/031,865, filed Feb. 27, 2008, and entitled "STREET LIGHT MONITORING SYSTEM," the entire disclosures of which are hereby incorporated in-their entirety by reference.

FIELD OF THE INVENTION

Aspects of the present invention relate generally to streetlight monitoring, and more particularly to systems and methods for streetlight monitoring diagnostics.

BACKGROUND OF THE INVENTION

It is estimated that there are more than 60 million outdoor lights in the United States autonomously controlled by conventional photo-controls. These outdoor lights, when properly working, simply react to ambient light conditions, for example, to turn-on at dusk and turn-off at dawn. This method of operating outdoor lights results in many lights being on when they are not needed, and it significantly increases outdoor lighting system operating costs.

The use of conventional photo-controls to control outdoor lights (luminaires) also leads to maintenance and repair issues. There are significant costs associated with hiring qualified maintenance personnel and buying equipment such as, for example, special maintenance vehicles required to access light fixtures for replacing lamps and servicing electrical components. To discover faulty fixture operations, light system owners and operators must resort to sending maintenance personnel to do "drive-by" visual examination of all units, which often number in the thousands or wait for a customer to report a malfunction. This drive-by must be done at night to detect non-functioning fixtures. These high costs limit how many lights can be repaired or serviced on any given day and force many light system operators to maintain their outdoor lights on an as needed basis (i.e., only when they are notified of an inoperable light). Understandably, this maintenance methodology is highly inefficient because it ties up resources as crews and equipment randomly travel to failed, geographically dispersed outdoor lights.

SUMMARY OF THE INVENTION

According to an example embodiment of the invention, there is an intelligent luminaire manager. The intelligent luminaire manager includes a voltage sensor for measuring a voltage provided to a luminaire; a current sensor for measuring a current provided to the luminaire; and a controller configured to receive voltage information corresponding to the voltage measured by the voltage sensor and current information corresponding to the current measured by the current sensor. In addition, there is a luminaire diagnostic program stored in a memory of the controller, where the luminaire diagnostic program is operative to: compute a first average real power based upon the received voltage information and the received current information for a first time period; compute a second average real power based upon the received voltage information and the received current information for a second time period subsequent to the first time period; determine whether the second average real power has increased beyond the first average real power by at least a preset amount; and generate a fixture status indication associated with the luminaire based upon the determination.

According to another example embodiment of the invention, there is another intelligent luminaire manager. The intelligent luminaire manager includes a voltage sensor for measuring a voltage provided to a luminaire; a current sensor for measuring a current provided to the luminaire; and a controller configured to receive voltage information corresponding to the voltage measured by the voltage sensor and current information corresponding to the current measured by the current sensor. In addition, there is a luminaire diagnostic program stored in a memory of the controller, where the luminaire diagnostic program is operative to: update a reference power value based upon an average real power computed using the received voltage information and the received current information; compute a current real power based upon the received voltage information and the received current information; increment a cycling counter based upon determining, while the luminaire is associated with an ON state, that the current real power is less than a first threshold associated with the reference power value; and identify a cycling fault based upon the cycling counter exceeding a second threshold.

According to an example embodiment of the invention, there is yet another intelligent luminaire manager. The intelligent luminaire manager includes a first voltage sensor for measuring a line voltage received by the intelligent luminaire manager; a second voltage sensor for measuring a load voltage associated with a luminaire; and a controller configured to receive voltage information corresponding to voltages measured by the first and second voltage sensors. In addition, there is a luminaire diagnostic program stored in a memory of the controller, where the luminaire diagnostic program is operative to: compare the line voltage to the load voltage; and determine a miswiring configuration associated with one or both of the intelligent luminaire manager and the luminaire based on the comparison of the line voltage to the load voltage.

BRIEF DESCRIPTION OF THE DRAWINGS

Reference will now be made to the accompanying drawings, which are not necessarily drawn to scale, and wherein:

FIG. 2 is a diagram illustrating street lights networked together using intelligent luminaire managers according to an example embodiment of the invention.

FIG. 5B is a diagram illustrating an intelligent luminaire manager field unit according to an example embodiment of the invention.

FIG. 8B illustrates example wiring conditions, according to an example embodiment of the invention.

DETAILED DESCRIPTION OF THE INVENTION

The present invention will now be described more fully hereinafter with reference to the accompanying figures, in which like numerals indicate like elements throughout the several drawings. Some, but not all embodiments of the invention are described. Indeed, these inventions may be embodied in many different forms and should not be construed as limited to the embodiments set forth herein; rather, these embodiments are provided so that this disclosure will satisfy applicable legal requirements, be thorough and complete, and will fully convey the scope of the invention to those skilled in the art.

Figure 1:
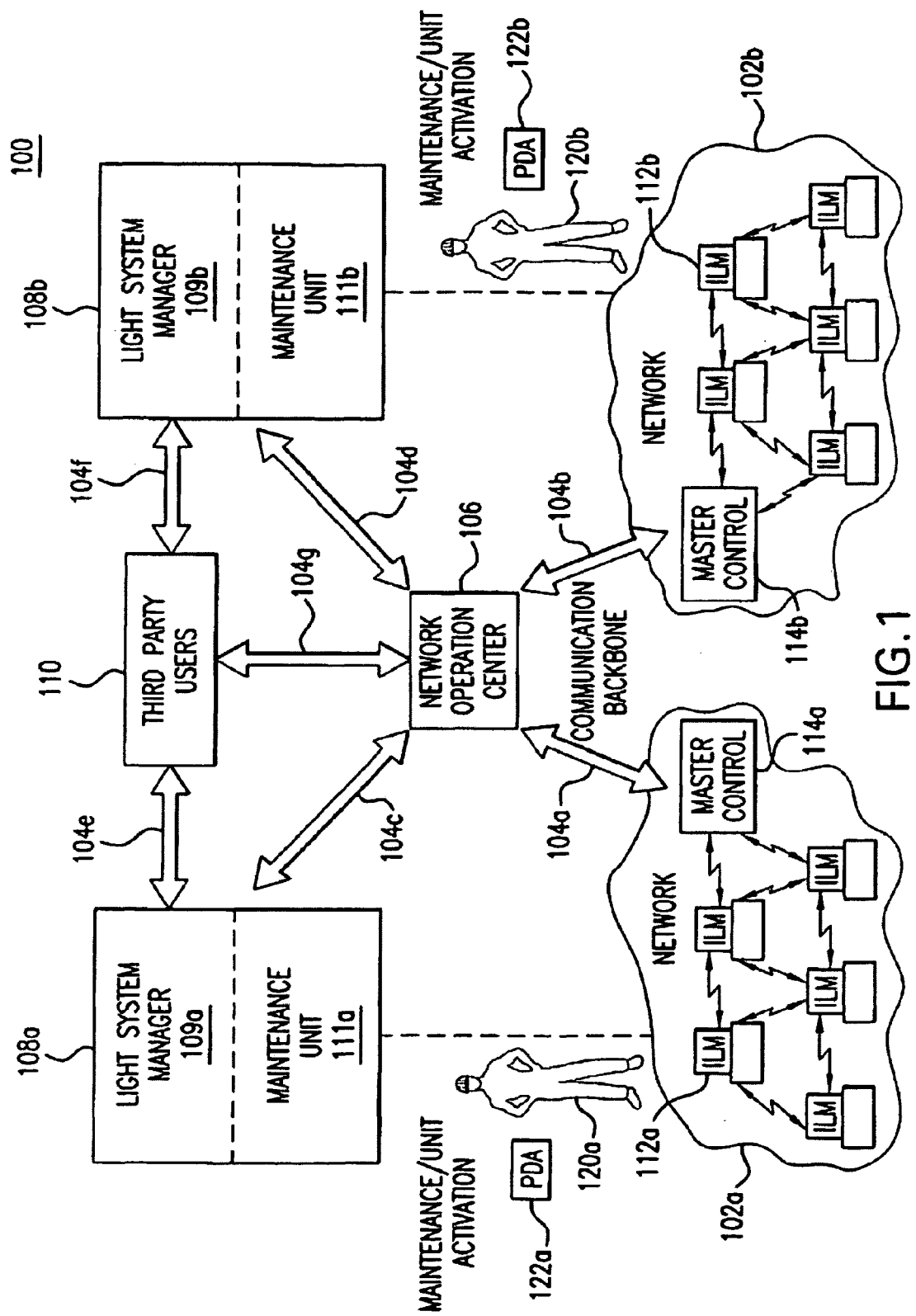
FIG. 1 is a diagram illustrating a light management system according to an example embodiment of the invention.

FIG. 1 illustrates a light management system 100 having networked intelligent luminaire managers 112 according to an example embodiment of the invention. As illustrated in FIG. 1, the light management system 100 includes networks 102a and 102b, a network operation center 106, light system owner/operators 108a and 108b, and third-party users 110. These subsystems of system 100 are linked together using appropriate communication means such as, for example, radio frequency communications, optical communications and/or power line carrier to form communications backbone 104.

Each of the networks 102a and 102b includes several intelligent luminaire managers (ILMs) 112 and a master control 114. The intelligent luminaire managers 112 communicate with each other and with master controller 114 using, for example, short-range radio frequency (RF) communication links. In an example embodiment, these RF communication links operate in the 900 MHz unlicensed band and have a range of about 1000 feet, but it will be appreciated that other frequencies and ranges may be utilized as well. As described further below with reference to FIGS. 2 and 3, each of the intelligent luminaire managers 112 may control operation and/or diagnostics of a light fixture, which may also be referred to as a luminaire.

Networks 102a and 102b in FIG. 1 each monitor and control operation of a light system or subsystem. These light systems are represented as being operated and maintained by light system owner/operators 108a and 108b respectively. Accordingly, data collected by intelligent luminaire managers 112a regarding the status of the light system represented by network 102a is forwarded to owner/operator 108a. Data collected by intelligent luminaire managers 112b regarding the status of the light system represented by network 102b is forwarded to owner/operator 108b. It will be appreciated that while networks 102a and 102b have been illustrated as distinct networks, the networks 102a and 102b may be operative with each other. For example, data collected by one of intelligent network luminaire manages 112a (in network 102a) may be forwarded to another intelligent luminaire manager 112b (in network 102b), and network 102b may assist in the forwarding of the received data to the owner/operator 108a. Owner/operators 108a and 108b also have the capability to send commands to and/or reprogram operation of the intelligent luminaire managers coupled to their lights using the data network shown in FIG. 1. This allows owner/operators 108a and 108b to adjust the operation of their respective light system.

In example embodiments of the invention, networks 102 may be peer-to-peer networks, mesh networks, or a combination thereof. These networks may support, for example, three levels of devices: master controllers 114; network routing devices, for example, intelligent luminaire manager 112; and other nodes such as RF device 202 (see FIG. 2). However, it will be appreciated that the other nodes such as RF device 202 may also be configured as network routing devices as well, according to an example embodiment of the invention.

Each of the network links between intelligent luminaire managers 112 includes a two-way communication channel. These two-way communication channels between intelligent luminaire managers 112 support, for example, over the air or power-line carrier re-keying and re-programming of these intelligent control devices. This allows for on-demand, turn-on and turn-off, for example, of selected street lights coupled to intelligent luminaire managers 112.

In an example embodiment, each intelligent luminaire manager 112 maintains an internal clock which may be synchronized throughout the entire network or portions of the network. The clock may be local to the device and/or maintained at a selected location and transmitted to each luminaire manager 112. This permits accurate date/time stamps to be added to data sent to network operations center 106 and for time-based control of intelligent luminaire managers 112.

In example embodiments of the invention, the intelligent luminaire managers 112 may support commands sent from master controller 114 to alternate or utilize different routing paths. Additionally, intelligent luminaire managers 112 may automatically attempt to reconnect to network 102 if a signal is lost for more than a selected period of time (e.g., after 15 minutes, after 30 minutes, after 60 minutes, etc.). Each intelligent luminaire manager 112 is capable of rerouting data through an alternative path, should one or more of the intelligent luminaire managers 112 fail. When a failed or new intelligent network controller 112 reenters network 102, other devices within the network pass on the activation or installation of the new intelligent luminaire manager to other network routing devices.

Master controllers 114a and 114b may serve as gateways between their associated intelligent luminaire managers 112 and network operation center 106. It will also be appreciated that one or more intelligent luminaire managers 112 may also be configured to be a master controller 114 as well. Each master controller 114 is coupled to network operation center (NOC) 106 through a communication backbone channel 104. In embodiments, communication backbone channels 104 can be, for example, electrical and/or optical land line communication channels, satellite communication channels, paging network channels, power line carrier channels, RF links, and/ or cellular communication channels. These communication channels can include public and/or private communication means (e.g., utility-owned lines and/or the Internet).

In an example embodiment, network operation center 106 couples to master controllers 114 via an internet protocol infrastructure provided by third-party carrier network services. Master controllers 114 may optionally provide data concentration and compression, and thereby reduce the overall service fees for third party leasing arrangements of communication services. Master controllers 114 may also include a data storage capability so that data to and from intelligent luminaire managers 112 can be stored during network communication disruptions and transmitted after communications are restored.

In an example embodiment, each master controller 114 may connect with network operation center 106 at predetermined times and uploads the current status of all intelligent luminaire managers 112 within its area of responsibility and any devices that have entered network 102 since its last update to network operations center 106. For high-priority communications, such as, for example, detection of a failed lamp, master controller 114 may make unscheduled communications to network operation center 106. Many variations of communications between the master controller 114 and the network operation center 106 are available in accordance with example embodiments of the invention.

Each master controller 114 may be responsible for linking several intelligent luminaire managers 112 to the network operation center 106. For example, in an example embodiment, more than 500 intelligent luminaire managers may be linked by a single master controller 114 to network operation center 106, although fewer intelligent luminaire managers may be linked as well. Each master controller 114 may be programmed from network operation center 106, according to an example embodiment of the invention.

In certain example embodiments, the master controller 114 may be capable of inheriting the features of network 102 routing devices, such as intelligent luminaire manager 112, for communications within network 102. Master controller 114 also can implement, for example, a TCP/IP stack for communications over communication backbone channel 104 with network operation center 106. Master controller 114 may also include memory such as non-volatile storage and cache data representing the status of all intelligent luminaire managers 112 for which it is responsible.

As described in more detail below, in accordance with example embodiments, master controller 114 may provide authentication and authorization to radio frequency devices (or other intelligent luminaire managers) wanting to enter network 102. Master controller 114 may communicate with intelligent luminaire managers 112 and optimize routing within its network cluster. Master controller 114 may also include alternative power arrangements (e.g., solar power cells) or a backup energy source (e.g., a battery) sufficient to power master controller 114, for example, for up to 24 hours of operation.

Network operation center 106 may comprise one or more computer processors that are operable to execute one or more computer-executable instructions for performing or directing one or more operations or services as described herein. The network operation center 106 may provide a variety of services for light system owner/operators 108. These services include, for example, 24-hour-a-day, seven-day-a-week data storage and forwarding services for data flowing between light system owner/operators 108 and their respective intelligent luminaire managers 112. Network operation center 106 may be responsible for configuring, monitoring, and operating the router switches and other communication equipment that comprise the data network illustrated by FIG. 1. In an example embodiment, network operation center 106 may manage and allocate internet protocol addresses and domain names for the data network, manage and allocate nodes for the data network, and provide database management services, network security management, and other network services. In addition, the network operation center 106 may utilize the information, including status information, received from one or more intelligent luminaire managers 112 in performing network-level diagnostics, as described herein.

As illustrated in FIG. 1, network operation center 106 interfaces with a plurality of light system owner/operators 108 and/or other appropriate entities. Each light system owner/operator is shown comprising a light system manager 109 and a maintenance unit 111.

Maintenance personnel 120 from the maintenance units may be responsible for repairing, replacing, and maintaining their own respective light systems. Maintenance personnel 120 may also be responsible for initial installation and activation of their intelligent luminaire managers 112 with the aid of a wireless device such as a personal data assistant (PDA) hosted, intelligent luminaire manager field unit 122, or another microprocessor based device. This field unit is described in more detail below with reference to FIGS. 5A and 5B.

In operation, the system 100 may perform as illustrated by the following example cycle of events. An owner/operator 108 of an outdoor light system may wish to reduce operation and maintenance costs associated with his or her light system. The owner/operator 108 may therefore have maintenance personnel 120 install and activate intelligent luminaire managers 112, for example, as the conventional photo-controls are replaced due to failures, according to an example embodiment of the invention. A master controller 114 may also be installed in the vicinity of one of the intelligent luminaire managers 112 (e.g., on a nearby pole or building rooftop).

During the installation and activation of each intelligent luminaire manager 112, selected information such as the intelligent luminaire manager's identification number, GPS grid coordinates for the location of the installation, the type (e.g., HID, non-HID, LED, etc.) of light equipment being controlled, a digital photo of the installation, and/or initial equipment parameters (e.g., electrical specifications such as voltage and/or current specifications associated with the luminaire) is collected by maintenance personnel 120 with the aid of the PDA-hosted field unit 122. This information is then stored in the owner/operator's maintenance system records and/or at the network operation center 106. In example embodiments, the PDA-hosted field unit 122 can communicate with intelligent luminaire managers 112 as well as master controllers 114 to receive information and/or upload information. Likewise, the PDA-hosted field unit 122 can likewise interface with the network operation center 106 to download selected information from the PDA-hosted field unit 122 to the network operation center 106.

Using the services of network operation center 106 and a computer connected to network operation system 106 (e.g., via a secure Internet link), the owner/operator 108 is able to monitor and control his or her lights. For example, if a light fails or is determined to be degraded, the intelligent luminaire manager 112 coupled to the light may send an alarm to owner/operator 108, indicating that a failure has occurred or is likely to occur, via the network and network operation center 106. This alarm notifies light system owner/operator 108 of the changed light system status and allows owner/operator 108 to take appropriate action.

In an example embodiment, the alarm may interact automatically with the owner/operator's maintenance program and may generate a work order that informs maintenance personnel 120 what actions are needed. The work order might include, for example, the time of the alarm, the location of the degraded or failed equipment, and what equipment or parts are needed to correct the problem that caused the alarm. This work order may be downloaded into the PDA-hosted field unit 122 and used to guide maintenance personnel 120 to the site of the degraded or failed equipment. Once the repairs to the light are made, intelligent luminaire manager 112 may update the status for the light and the alarm may be cleared. In an alternative embodiment, the alarm may be cleared when owner/operator 108 updates his or her maintenance records, for example, using data collected by the intelligent luminaire manager field unit 122 while the repair was being performed. In another embodiment, failure is only reported to owner/operator 108 when the failure has occurred a specified number of days in a row.

Once owner/operator 108 has installed intelligent luminaire managers on its lights, owner/operator 108 can control when the lights are turned-on and turned-off. This is achieved by sending commands over the data network to individual or assignable groups of intelligent luminaire managers 112 and/or reprogramming a control program stored in a memory of each intelligent luminaire manager or group of assignable intelligent luminaire managers. More details regarding the functionality of intelligent luminaire managers 112 is provided below.

Also shown in FIG. 1 are third-party users 110. Third-party users 110 are managers/users of system 100 other than light system owner/operators 108 and network operation center 106 personnel. For example, a third-party user 110 may be someone hired by an owner/operator 108 to operate his or her light system or someone who is leasing, or otherwise appropriately using, bandwidth in system 100 as explained in more detail below with reference to FIG. 2.

FIG. 2 illustrates a plurality of street lights 200 that form part of a light system operated and maintained by an owner/operator 108. Each street light 200 is equipped with an intelligent luminaire manager 112 mounted, for example, on top of a light fixture 204 of street lamp 200. In the embodiment shown, intelligent luminaire manager 112 may be configured and housed in an enclosure that conforms to appropriate NEMA and ANSI standards so that it can be exchanged one-for-one with a prior-existing photo-control used to control light fixture 204. This compatibility allows an intelligent luminaire manager 112 to be installed on a light fixture 204 without requiring a new mount and without requiring any rewiring or physical modification of the fixture. Persons skilled in the relevant arts are familiar with industry standards such as NEMA and ANSI C136 standards, and they will understand, based on the disclosure herein, how to adapt intelligent luminaire manager 112 for selected applications and customers.

As shown in FIG. 2, an intelligent luminaire manager 112 may communicate using an RF communication link with its neighbors mounted on neighboring street lights 200. In an embodiment, an intelligent luminaire manager 112 also is capable of communicating with other nearby devices that include, for example, an RF device 202. This communication can be unidirectional or bidirectional. The unidirectional communication can be from an RF device 202 to the intelligent luminaire manager 112 or from the intelligent luminaire manager 112 to RF device 202 depending on whether RF device 202 is a transmitting device or a receiving device. Communication with an RF device 202 may be established when an RF device 202 enters into the proximity or communication space of an intelligent luminaire manager 112 and is authorized to become a part of the network formed by intelligent luminaire manager 112 and its neighbors.

In an example embodiment, the RF device 202 may become a part of a network by transmitting a signal that is received by a communications unit inside intelligent luminaire manager 112. Intelligent luminaire manager 112 then reports the presence of RF device 202 to network operation center 106, via the network and a master control 114. RF device 202 may be allowed to simply transmit data over the network, or it may be allowed to transmit and receive data. This communication can be either open or encrypted. Intelligent luminaire manager 112 is able to block communications from RF device 202 if RF device 202 is assessed to be functioning improperly or if the RF device's 202 access is denied based on a blacklist maintained by the network operations center 106 or if the RF device 202 is interfering with the routing of higher priority traffic.

In example embodiments of the invention, the RF device 202 may be a blind slave. A blind slave is a device controlled by intelligent luminaire manager 112. One example use of a blind slave is to control the operation of an outdoor light (e.g., a house porch light or a driveway light). The blind slave coupled to the light receives commands from a nearby intelligent luminaire manager 112 to turn-on and turn-off the light, for example, in conjunction with the luminaire controlled by the intelligent luminaire manager 112. In one embodiment, blind slaves may be controlled by a utility in order to limit power usage during periods of high power demand and thereby prevent brown-outs or black-outs from occurring. The use of blind slaves is not limited to just photo control.

In example embodiments of the invention, the communication links between intelligent luminaire managers 112 can include, for example, power line carrier communication links or optical communication links. Thus, embodiments of the invention are not limited to using only RF communication links.

As described herein, the precise location of each intelligent luminaire manager device 112 is known or can otherwise be determined. Therefore, using appropriate algorithms, intelligent luminaire manager 112, master controller 114 and/or network operation center 106 may be able to accurately determine and report the location of any RF device 202. For example, in an example embodiment of the invention, master controller 114 is able to calculate interpolated coordinates for an RF device 202 based on information received from a variety of intelligent luminaire managers 112 and the master controller's knowledge of the locations of these luminaire managers 112.

It will be appreciated that the potential for communicating with radio frequency (RF) or radio frequency identification (RFID) type devices using the network formed by intelligent luminaire managers 112 is nearly boundless, according to an example embodiment of the invention. For example, an RF device 202 might be included in a car and used to monitor and locate stolen cars as they pass by or park near streetlights 200. An auto insurance company can pay a light system owner/operator to monitor for and report the location of stolen cars using his or her network. In this example, an RF device 202 might be configured to start transmitting a stolen car signal, for example, whenever the car's engine was started without using the car's ignition key. This stolen car signal would be detected by an intelligent luminaire manager 112 and reported via the network to an appropriate individual (e.g., a third-party user 110 such as an insurance company representative and/or a local law enforcement official).

A similar use to that described above of the network capabilities of intelligent luminaire managers 112 would be to identify and locate an individual under house arrest, wearing an ankle bracelet, who has left his or her house. Other possible uses include, but are not limited to: providing security monitoring to determine if a nearby gate is open or closed or whether a particular system is on or off; to provide an interface to General Motor's ON-STAR system; to provide gun shot detection; to provide auto traffic and pedestrian monitoring; to provide public address audio communications and broadcast warning information (e.g., radiation alerts, bio alerts, chemical alerts, smog alerts, etc.); to provide high crime area surveillance; to locate lost individuals, children and pets; to relay weather monitoring data, power monitoring data, etc.; to repeat cellular communications, WiFi communications, or Internet communications; and to read and/or relay electric meter data, gas meter data, and/or water meter data for public utilities. Still other uses will be available in accordance with other example embodiments of the invention.

Figure 3A:
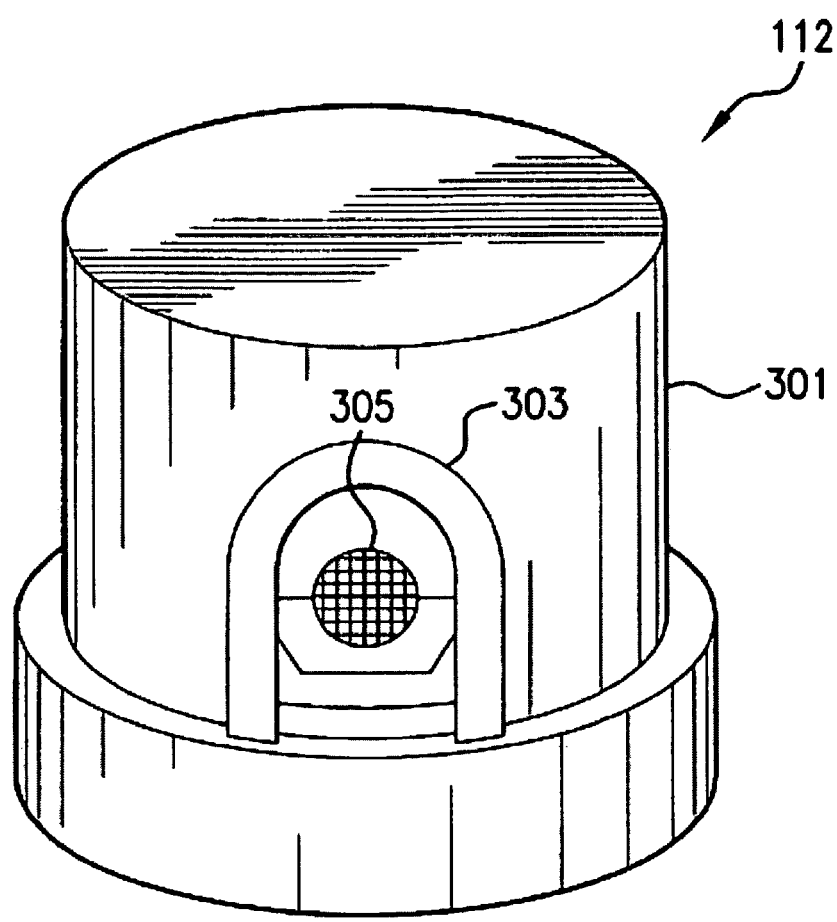
FIG. 3A is a diagram illustrating an intelligent luminaire manager according to an example embodiment of the invention.

FIG. 3A shows a detailed view of an enclosure 301 for intelligent luminaire manager 112 according to an embodiment of the invention. As shown in FIG. 3A, housing 301 of intelligent luminaire manager 112 includes a window 303 that exposes a photo-detector 305 to ambient light. This allows intelligent luminaire manager 112 to be programmed to turn-on and/or to turn-off based on ambient light conditions in addition to an internal clock. A filter can be used to adjust the sensitivity/response of photo-detector 305 (e.g., a filter such as an infrared filter can be used to prevent the unwanted turning-on and turning-off of a light due to passing clouds, sky condition or the influence of other nearby lights).

In an example embodiment, the intelligent luminaire manager 112 includes at least one LED (not shown) internal or external to enclosure 301 for communicating with maintenance crews. In one embodiment, the LED transmits infrared signals that are received by PDA-hosted field unit 122. In another embodiment, the LED flashes a visual code that can be seen and interpreted by the maintenance crew. For example, when an intelligent luminaire manager 112 is initially installed, it sends a message to a nearby intelligent luminaire manager 112 and receives back an acknowledgement signal. When this acknowledgment signal is received by the newly installed intelligent luminaire manager 112, its LED sends or flashes a code to let the maintenance crew know that the signal has been sent and an acknowledgement signal received. This lets the maintenance crew know that the intelligent luminaire manager 112 is working properly. In an embodiment, an LED signal may be different colors to indicate different status. Likewise, another light emitter besides an LED may be utilized in accordance with other example embodiments of the invention.

As noted herein, the enclosure 301 may conform to appropriate NEMA and ANSI standards so that it can be installed on an intended light fixture without requiring a new mount and without requiring any rewiring or physical modification of the fixture. In example embodiments, enclosure 301 may be formed from a highly durable material, such as plastic, that is appropriate for outdoor use and that will withstand the expected weather and temperatures variations at the intended location of installation. Enclosure 301 also can be coated with a weather-resistant material.

In an example embodiment, each luminaire manager 112 or enclosure 301 has one or more scannable barcodes securely attached for purposes of identification. An identification code can also be stored in a memory of each luminaire manager 112. In an example embodiment, PDA-hosted field unit 122 is used to read and/or write the identification code to the memory of each luminaire manager 112.

Figure 3B:
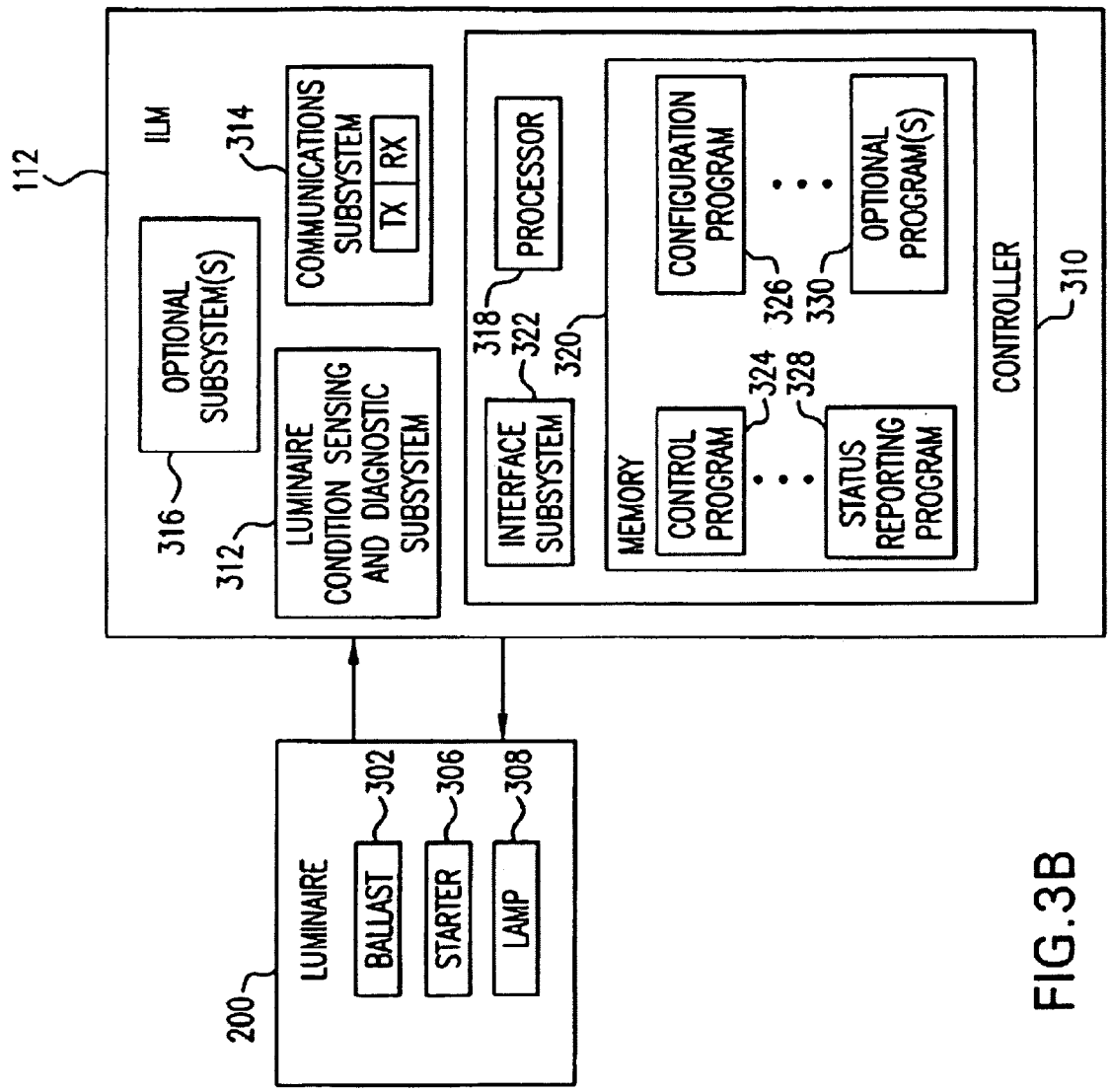
FIG. 3B is a block diagram illustrating a luminaire and the intelligent luminaire manager of FIG. 3A according to an example embodiment of the invention.

FIG. 3B is a block diagram that further illustrates the features and functionality of an intelligent luminaire manager 112 according to an example embodiment of the invention. As shown in FIG. 3B, the intelligent luminaire manager 112 is coupled to and controls a light or more precisely a luminaire 200. Luminaire 200 includes a ballast 302, a starter 306, and a lamp 308. Intelligent luminaire manager 112 includes a controller 310, a luminaire condition sensing and diagnostic subsystem 312, a communications subsystem 314, and other optional subsystems 316.

In an example embodiment, luminaire 200 is a conventional luminaire such as, for example, a street light. Controller 310 may include a processor 318, memory 320, and an interface subsystem 322. Memory 320 stores a variety of programs and/or computer-executable instructions that are executed and/or implemented using processor 318. These programs and/or computer-executable instructions may include, for example, a luminaire control program 324, luminaire and intelligent luminaire manager configuration program 326, status reporting program 328, and other optional programs 330.

According to an example embodiment of the invention, an intelligent luminaire manager 112 may be utilized to turn-on and turn-off lamp 308 on demand. Commands to turn-on and turn-off lamp 308 can be delivered to intelligent luminaire manager 112 via the data network illustrated in FIG. 1. In an example embodiment, data sent by an owner/operator 108 over the network is used to program a luminaire control program 324 stored in a memory 320 of intelligent luminaire manager 112. This program interacts with a network synchronized clock/timer function and supports an on-time and an off-time for lamp 308 for each day of the week with a one-minute time resolution. Example on-time and off-time commands that can be programmed include: (1) turn on lamp 308 at time X, and turn off lamp 308 at time Y; (2) turn on lamp 308 at time X, and turn off lamp 308 Y minutes after it is turned on; (3) turn on lamp 308 at dusk, and turn it off X minutes after it turns-on; and (4) turn on lamp 308 at dusk, and turn it off X minutes after dawn.

The above-described programmable commands to turn-on and turn-off lamp 308 are illustrative only and not intended to limit embodiments of the invention. Other programmable commands that can be also be used in accordance with other example embodiments of the invention. For example, commands can be programmed to turn lamp 308 on only during certain days of the week, to turn-on and turn-off lamp 308 at different times during different days in a given week, or all lamps in a group can be turned-on at a specified time and turned-off, for example, at dawn. In an example embodiment, selected lamps can be sent a command to turned-off during periods of high power demand. Likewise, turn-on and turn-off times can be programmed to meet state or local light trespass codes, and these can be re-programmed remotely if the light trespass codes change.

In an example embodiment, in the event an intelligent luminaire manager 112 loses contact with network operations center 106 or master controller 114, due for example to a network failure, intelligent luminaire manager 112 may maintain a current program or otherwise revert to a pre-stored program for controlling luminaire 200. For example, this could be to turn on lamp 308 at dusk and to turn it off at dawn. Intelligent luminaire manager 112 can tolerate and continue operating through expected energy surges and sags without disruption of operation.

In an example embodiment, an intelligent luminaire manager 112 uses luminaire condition sensing and diagnostic subsystem 312 to monitor a condition or status associated with the luminaire 200. As described herein, luminaire condition sensing and diagnostic subsystem 312 may be operative to determine or detect a fixture malfunction, a cycling condition, or another fault or condition, which may be reported as status data or events/alarms to the owner/operator 108.

Figure 3C:
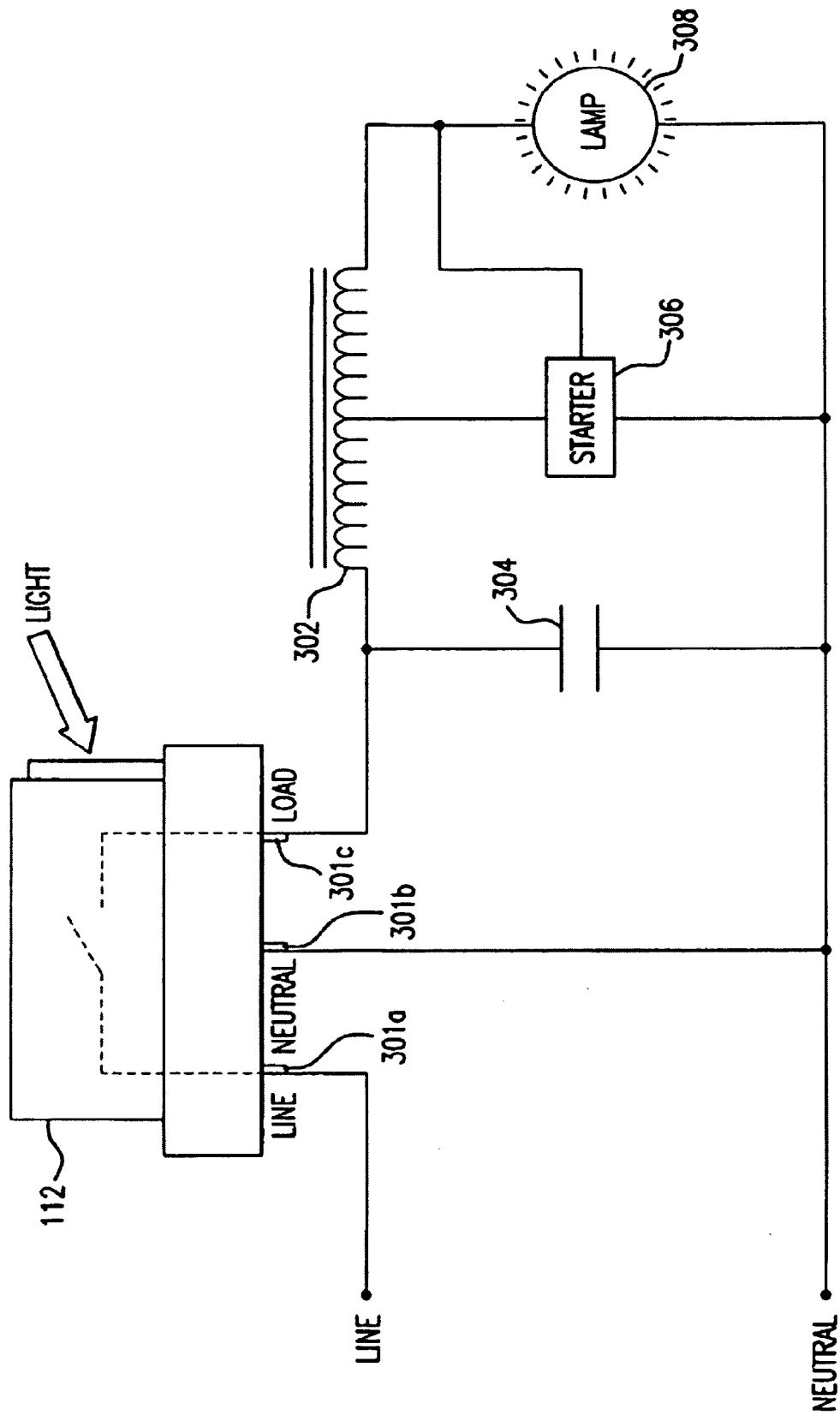
FIG. 3C is a circuit diagram illustrating a luminaire and the intelligent luminaire manager of FIG. 3A according to an example embodiment of the invention.

FIG. 3C is an example circuit diagram that further illustrates luminaire 200 and intelligent luminaire manager 112 according to an example embodiment of the invention. The circuit diagram is illustrative and not intended to limit embodiments of the invention. As shown in FIG. 3C, in an example embodiment, intelligent luminaire manager 112 may be a three-prong device per ANSI C136.10 or similar standard that acts like a switch to control the power supplied to luminaire 200. A first prong 301a of intelligent luminaire manager 112 connects to an energized line of a power supply (not shown). A second prong 301b of intelligent luminaire manager 112 connects to a neutral line or common of the power supply. A third prong 301c of intelligent luminaire manager 112 connects to a load line of luminaire 200. The load line is attached to ballast 302 and an optional power factor correction capacitor 304. Ballast 302 is connected to starter 306 (if used) and lamp 308. Optional power factor correction capacitor 304, starter 306, and lamp 308 are each connected to the neutral line of the power supply.

Figure 3D:
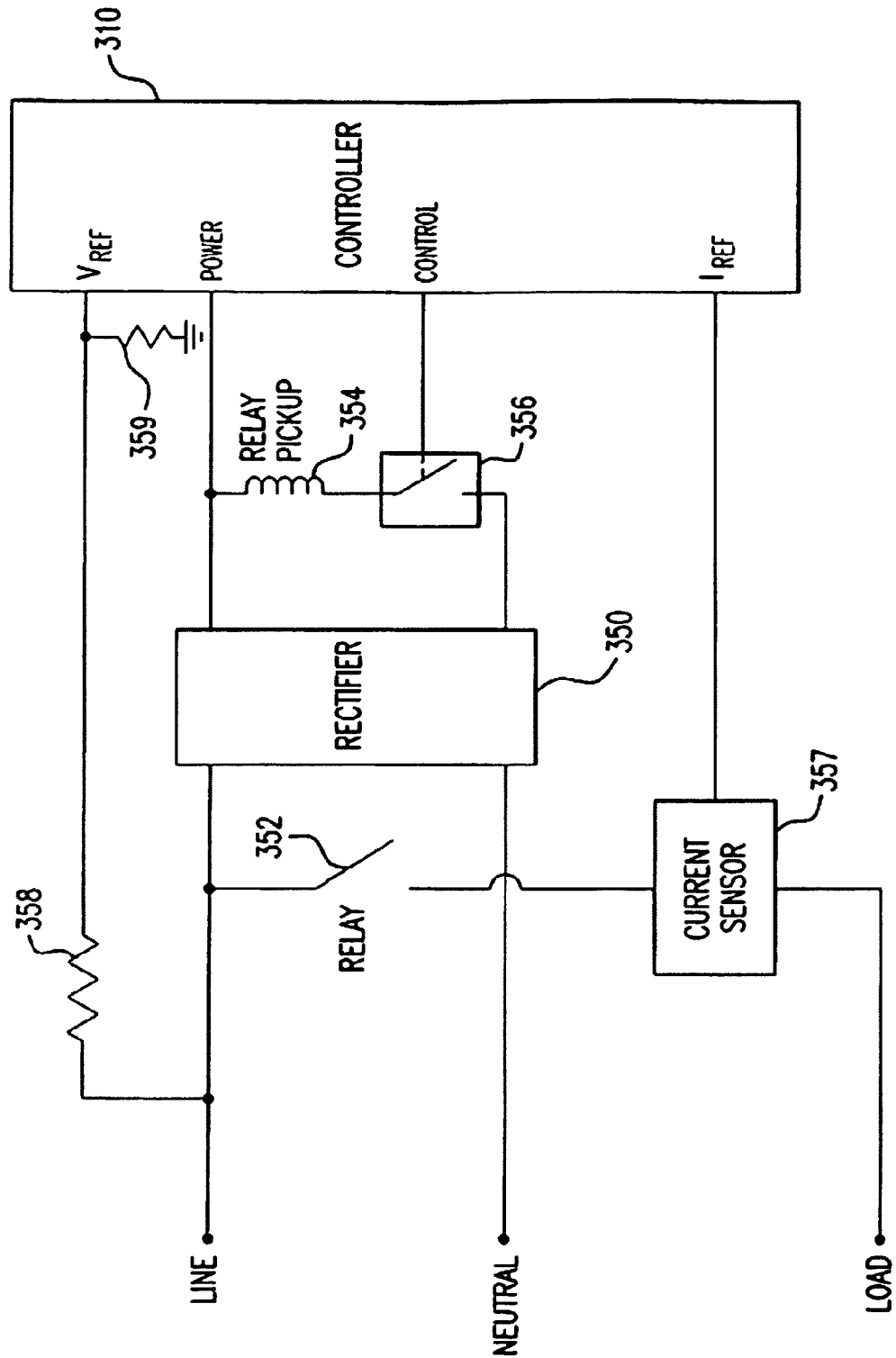
FIG. 3D is a circuit diagram further illustrating the intelligent luminaire manager of FIG. 3A according to an example embodiment of the invention.

FIG. 3D is a more detailed circuit diagram of an intelligent luminaire manager 112 according to an example embodiment of the invention. As shown in FIG. 3D, power from the power supply is rectified by a rectifier 350. Rectified power is filtered and regulated, and provided to controller 310. In an embodiment, controller 310 may be a commercially available microprocessor or microcontroller. Rectified power is also provided to a pickup coil 354 of a relay 352. When a control signal provided by controller 310 closes a switch 356, pickup coil 354 is energized and closes a contact of relay 352. As illustrated in FIG. 3D, the closing of the relay contact provides power to luminaire 200.

As shown in FIG. 3D, two resistances 358 and 359 form a voltage divider network. The voltage developed across resistance 359 is a reference voltage (Vref) that is provided to controller 310 as an input parameter. A current sensor 357 is coupled between relay 352 and the load prong of intelligent luminaire manager 112. Current sensor 357 generates a reference current (Iref), which is also provided to controller 310 as an input parameter. In an example embodiment, current senor 357 is a current transformer. In another example embodiment, current sensor 357 is a current sensing resistor or Hall effect sensor. As described herein, the input parameters Vref and Iref may be used in diagnosing and providing an indication of the status or condition of luminaire 200. It will be appreciated that the voltage and current sensors described with respect to FIG. 4D are provided for illustrative purposes only, and that other voltage and current sensors are available in accordance with other example embodiments of the invention.

Based on the description contained herein, it will be appreciated that some or all of the functions and/or functionality described with regards to intelligent luminaire manager 112 herein can be implemented, for example, as an integral part of luminaire 200.

Similarly, functions and/or functionality described with respect to luminaire 200 (e.g., starter 306) can be implemented as a part of intelligent luminaire manager 112. Thus, the illustration and description of specific functions and functionality residing in luminaire 200 and/or intelligent luminaire manager 112 is illustrative and not intended to limit embodiments of the invention.

Figure 4A:
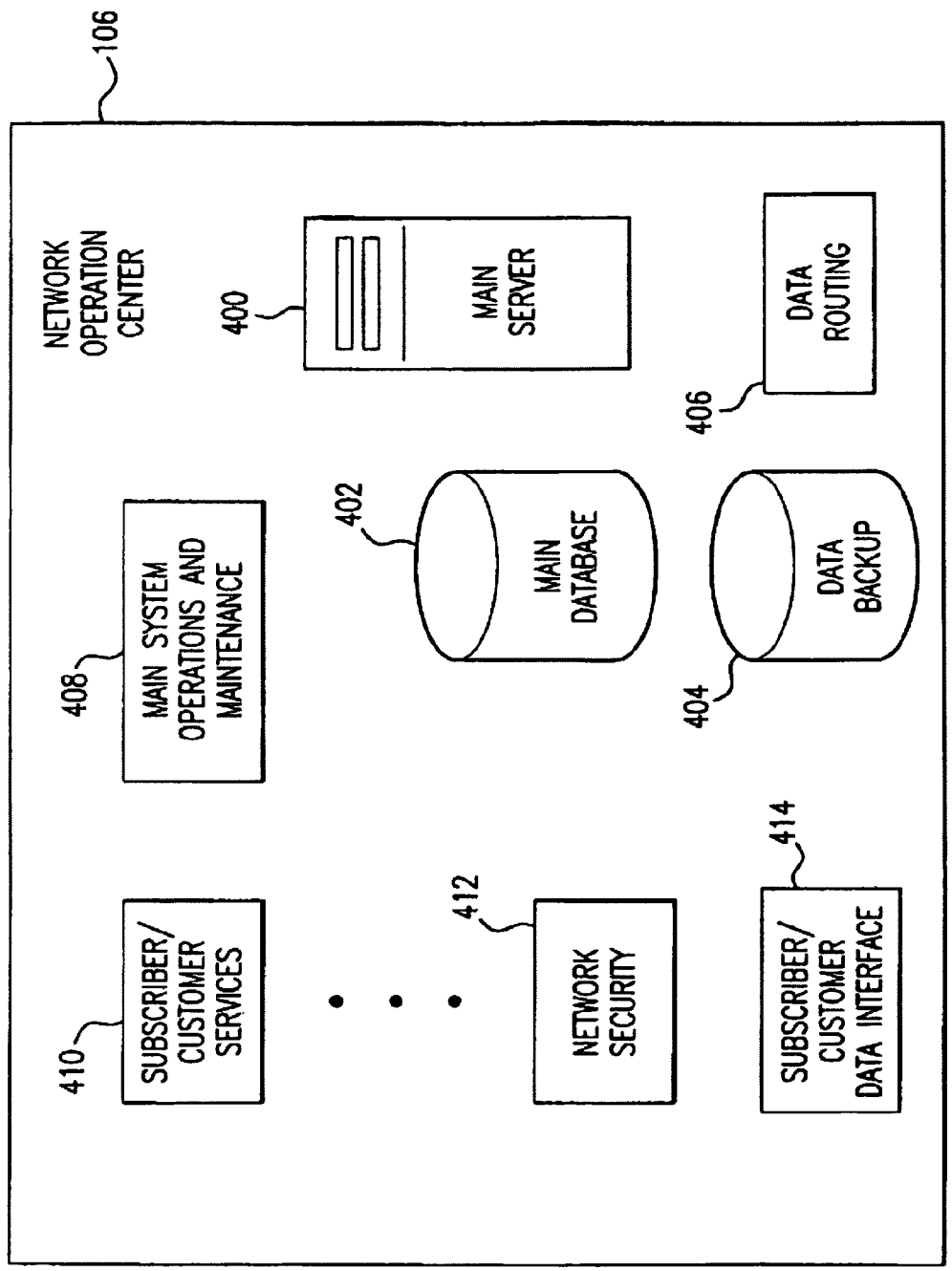
FIG. 4A is a diagram illustrating a network operation center according to an example embodiment of the invention.

FIG. 4A is a more detailed depiction of a network operation center 106 according to an example embodiment of the invention. As shown in FIG. 4A, network operation center 106 includes a main server 400, a main database 402, data backup 404, and data routing capabilities 406. The main server 400 may comprise one or more computer processors that are operable to execute one or more computer-executable instructions stored in one or more memories for performing or directing one or more operations or services as described herein. As described herein, network operation center 106 may provide one or more services, such as, for example, main data network system operation and maintenance 408, subscriber/customer services 410, network security services 412, and subscriber/customer data interface services 414. As used herein, the term subscriber/customer refers to a light system owner/operator 108 and/or a third-party user 110.

In an example embodiment, network operation services provided by network operation center 106 personnel include six major components: subscriber provisioning, network provisioning, traffic engineering, billing, service assurance, and security management. Subscriber provisioning refers to subscriber management, subscriber selection, and subscriber activation. Network provisioning refers to capacity planning, network design, and device provisioning. Traffic engineering refers to network traffic analysis and policy management. Billing refers to, for example, both settlement of accounts between and amongst subscriber/customers, and usage data collection, rating, invoicing, and collection of bills. In an example embodiment, network operations center 106 records customer information for each intelligent luminaire manager 112 that can be used by owner/operators 108 to support customer service queries and reports and billing of their respective customers. Service assurance refers to asset management, performance management, service-level management, fault management, trouble management, and work-force management. Security management refers to access fraud, service fraud, management access control, and denial of service. These network services may be provide a framework that provides scalability for a unified wide-area network platform that can be easily managed and controlled in real time, for example, over the internet using either standard web browsers or customer-specific applications developed within a software framework. Like the physical hardware of the network, the software may be scalable.

Scalability of the system can be ensured by distributing the necessary software over multiple servers. In addition, this increases both redundancy and reliability. A communications software program maintained by network operation center 106 provides a virtual private network for each gateway to the network operation center (e.g., master controllers 114). Network operation center 106 is capable of supporting many thousands of concurrent subscribers. Notable features of network operation center 106 include its store and forward data management technology; its management environment that supports and controls a massive subscriber base of mobile computers, integrated servers and web service users; its security and data independence that facilitates supporting large numbers of separate customers and their sensitive business data; and its ability to provide fast, secure, and highly-available synchronization between servers and the subscriber/customer populations they support.

In an embodiment, network operation center 106 records GPS coordinates for each node location (e.g., the locations of intelligent luminaire managers 112). This data is used to generate user display maps of node locations and to support workforce management reports that include node locations.

Network operation center 106, based on data collected, also is able to provide detailed information to its subscribers/customer regarding the type of fixture, lamp type, ballast type, and starter type operated by each intelligent luminaire manager 112. Additionally, network operation center 106 software is able to generate summary failure analysis reports, broken down by lighting system attributes such as, for example, fixture type, lamp type, ballast type, starter type, and hours of operation. This analysis is provided to specific customers and/or all customers, based on how often a component fails or requires a service call. The analysis preferably includes failure conditions identified by the network as well as information provided to call centers about the failures.

In an example embodiment, a time stamp is provided with data packet transported via a network such that resolution about events on the network can be identified, for example, within one minute. If a luminaire 200 controlled by an intelligent luminaire manager 112 fails, it preferably takes about one minute in this embodiment before an alarm is generated at an associated owner/operator's site. This alarm preferably displays both the location of the failed luminaire and the time of failure.

As shown in FIG. 4A, network operation center 106 maintains a database 402 that includes the current status of all nodes in the data network system. In an example embodiment, the bandwidth of the network is such that it can support video. In an example embodiment, the network operation center 106, via the networks 102, forwards requests from subscribes/customers for information, such as, for example, voltage levels and/or current levels at monitored devices, value of meters, power usage by individual devices, etc. Routine message traffic may be scheduled to occur at certain intervals. Examples are network status, device status, abnormal line voltage, power quality, tilt sensor to alert of pole failure, air quality, road conditions, for example, monitored by a video camera linked into the network, et cetera. The period of these. reporting intervals is programmable (e.g., from one-hour to 24-hour intervals in 15 minute increments or less). Event or alarm reporting may be handled on a priority basis, and it does not conform to a routine forwarding schedule.

In an example embodiment, when the alarm data is received at network operation center 106, it is compared to predetermined action stored in a program, and the actions are carried out as described. For example, the network operation center may send an email to certain individuals, a map showing the location of the failed device, and/or generate a work order by interfacing with a subscriber/customer's work-order program.

The type of data sent from network operations center 106 to a subscriber/customer is not limited, but in practical terms may be limited in its usefulness to a subscriber/customer based on ability to receive and use the data.

In an example embodiment, the message traffic passed between network operation center 106 and intelligent luminaire managers 112 includes applications data packages, query command packages, device status packages, event and alarm packages, and network status packages.

Subscriber/customer access to this data stored at the network operation center is controlled by password. Subscriber/customer notification of events is transmitted to the subscriber/customer, and no password is required to obtain this data.

In an example embodiment, network operation center 106 is able to identify when there is a power failure effecting a subscriber/customer's light system and when backup power is being used at master controls 114. For a system-wide power outage, network operation center 106 can consolidate alarm reports and generate a generalized message that is forwarded to an effected subscriber/customer (e.g., a light-system owner/operator 108).

As noted above, in the event of a power failure or a network failure such that a master controller 114 cannot provide data to network operation center 106 on a scheduled interval, the data is maintained at the master controller 114 until power and communications are restored. The stored data is then forwarded at the next scheduled reporting interval, unless specifically requested earlier by a subscriber/customer. In an example embodiment, master controller 114 includes battery back-up power. In another embodiment, master controller 114 is capable of transmitting an "I've Lost Power" signal when power is lost.

Network operation center 106 is responsible for IP protocol traffic analysis. Traffic is routed such that it is able to support peak loading of the data network and still pass data. In order to manage data, subscriber/customer commands may be limited during certain unexpected peak loads and held until bandwidth becomes available to forward this traffic. When a bandwidth limitation is being reached in a network 102, an alarm is sent to network operation center 106 so that traffic can be managed accordingly to control the peak load. Network operation center 106 personnel can monitor traffic loading on the network and install additional capacity as required.

In an embodiment, as noted above, network operation center personnel perform asset management functions, which include tracking the life cycle of node equipment, and replacing end-of-life equipment or degraded equipment before failure. For light system owner/operators 108, network operation center 106 data analysis programs can track the complete life of a device (e.g., the time it was installed, the number of hours it was operated, and a cause of failure).

Network security services 412 control access to the information stored by network operation center 106 using firewalls and prevent unauthorized access/network usage to prevent compromise of the data and/or network. In an example embodiment, network security services 412 may require both authentication and authorization. Security techniques may be implemented to prevent denial-of-service attacks and virus attacks that would cause the networks to fail or breakdown. Network security services 412 may also include intrusion tracking and the ability to trace and combat malicious acts by unauthorized users. In an example embodiment, a "call home" feature is used such that when a request for information or service is sent from a subscriber/customer to network operation center 106, the request is repeated and sent back to the subscriber/customer's known address by network operation center 106 to verify that the request actually came from that subscriber/customer. Network security services 412 may also employ and support data encryption.

In an embodiment, network operation center 106 as a part of its subscriber/customer service provides monthly reports summarizing asset status of monitored devices to subscribers/customers.

Additionally, in an embodiment, network operation center 106 sends messages to light system managers when a light is turned on and when it is turned off so that the light system manager can keep track of the present status of the light system assets.

Figure 4B:
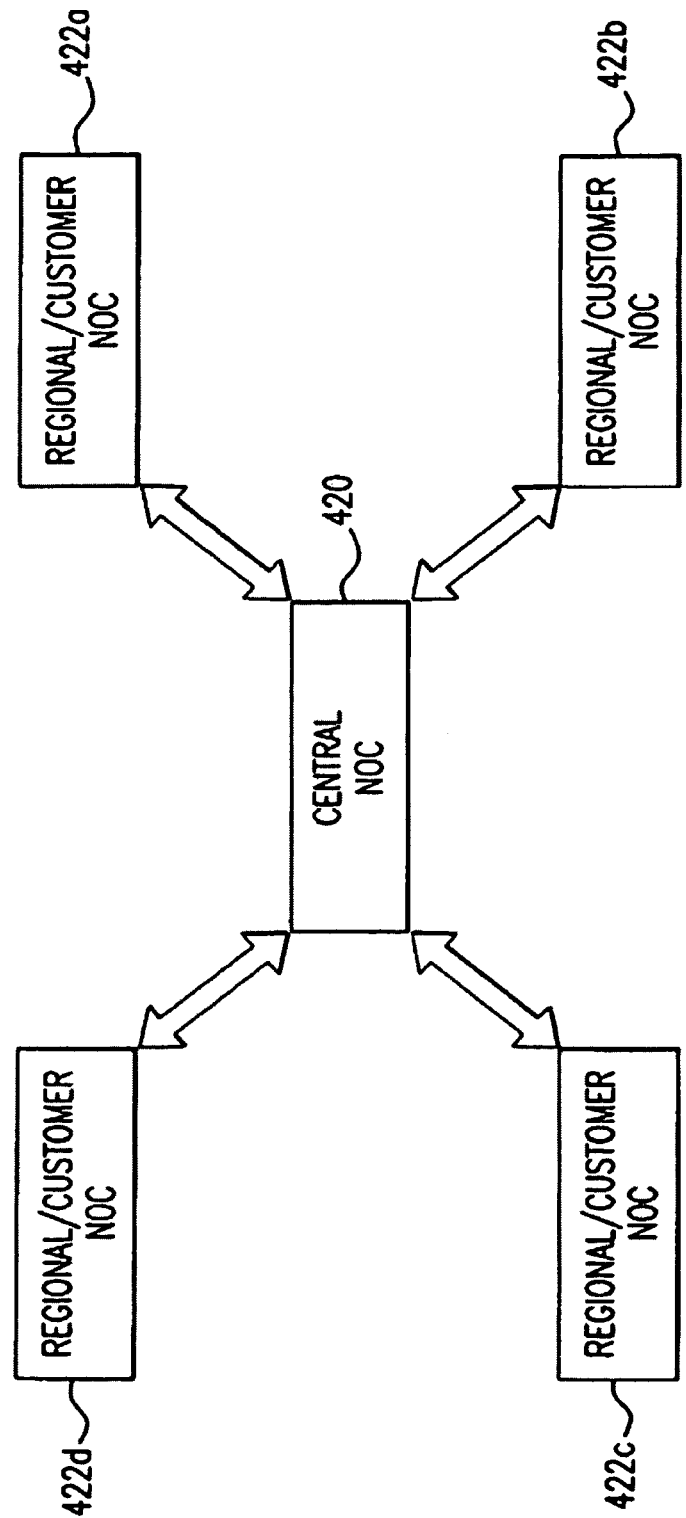
FIG. 4B is a diagram illustrating geographically distributed network operational centers according to an example embodiment of the invention.

FIG. 4B illustrates another embodiment of a network operation center according to the present invention. As shown in FIG. 4B, all the functions and functionality of network operation center 106 described above need not reside at a single geographical location. This functionality can be distributed over a wide geographical area. As shown in FIG. 4B, in an embodiment, the functionality of network operation center 106 is distributed across a central network operation center (NOC) 420 and one or more regional/customer network operation centers 422.

Figure 5A:
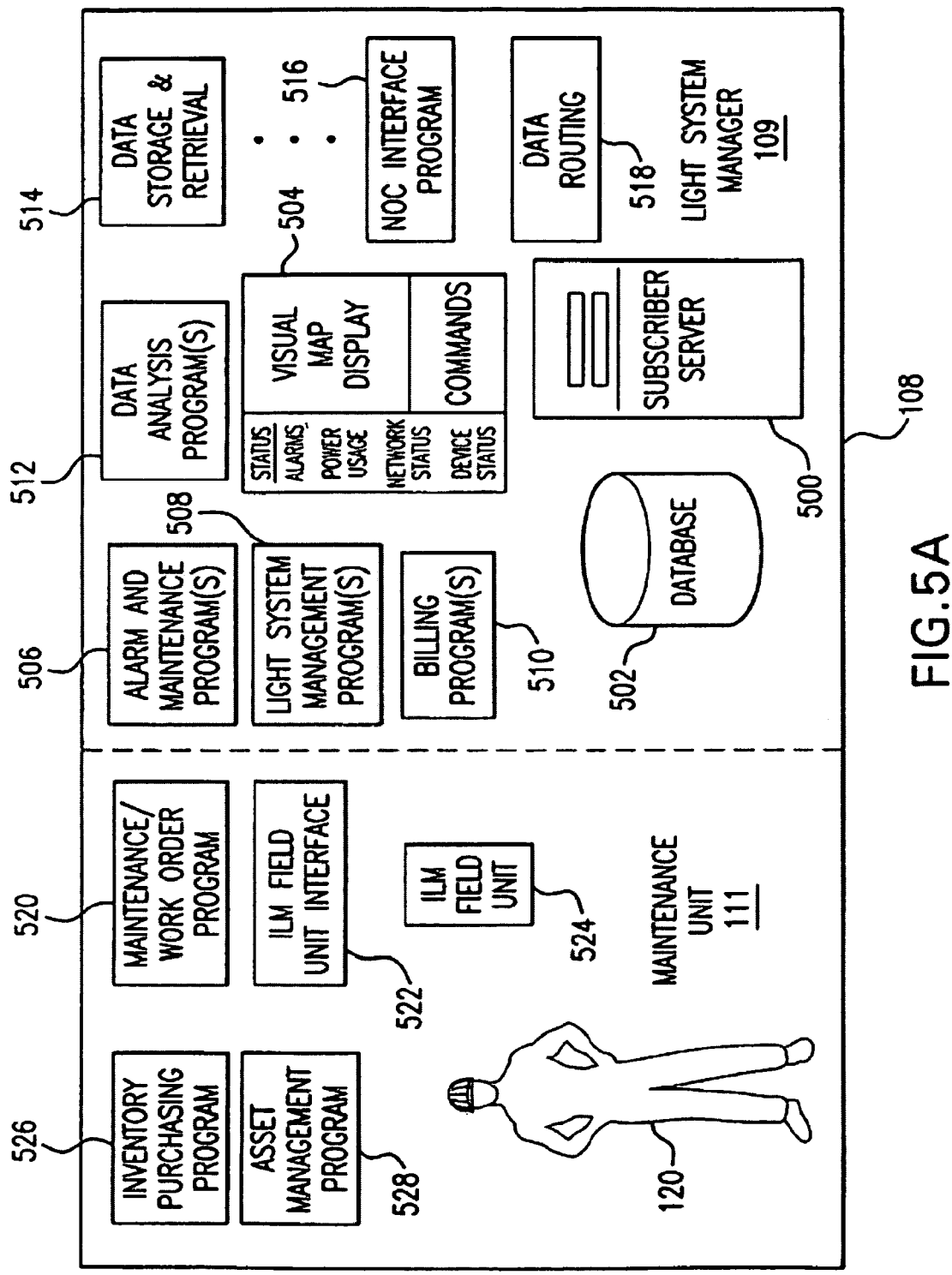
FIG. 5A is a diagram illustrating a light system owner/operator according to an example embodiment of the invention.

FIG. 5A depicts a light system owner/operator 108. As shown in FIG. 5A, owner/operator 108 may be divided into a light system manager portion 109 and a maintenance unit portion 111. The light system manager portion may include a subscriber server 500, a database 502, and a computer display 504.

Computer display 504 may present, in both a text and a graphical manner, information about the owner/operator's light system. The text and graphical information includes, for example, the status of any alarms, power usage, network status, and device status. The status may also be shown graphically on a visual map display. In an example embodiment, a graphical user interface presents a visual photometric mapping to a user, for example, of selected lights of the light system. This photometric mapping can provide the user with a visual representation of the illumination, for example, of a parking lot, a sports field, or other area of interest. The bottom portion of computer screen 504 shows commands being entered and responses being received from network operation center 106.

The light system manager may have the ability to run several programs at his or her site. These programs may include alarm and maintenance (e.g., repair dispatch) program(s) 506, light system management program(s) 508, billing program(s) 510, data analysis program(s) 512, a data storage and retrieval program 514, a network operation center interface program 516, and a data routing program 518. Each of these programs is further described below.

Alarm and maintenance program(s) 506 displays an alarm such that maintenance personnel 120 can take corrective action. In an embodiment, the program uses data that has been analyzed, for example, by network operation center 106 and schedules maintenance so that equipment in the field close to the end of its useful operating life can be replaced prior to failure. For predictability, this end of life analysis can be based on a larger population of equipment than only that owned and operated by a particular light system manager.

Light management program(s) 508 are used by the light system manager to reprogram devices in the field. Examples of this include, for example, turning lights on and lights off using a schedule rather than having them simply turn on at dusk and off at dawn.

Billing program(s) 510 keep track of when specific lights are used and generates customer bills accordingly. In an example embodiment, the rate charged for turning on and using a particular light can be based on the time it is turned on (e.g., during peak hours of operation or off-peak hours of operation).

Data analysis program(s) 512 maintain the state of components in use in a light system and compare, for example, each component's total time in use to an estimated life expectancy to predict a remaining time to failure for the component. When a component is at its expected end of life, the data generated by program(s) 512 can be used to create a work order to have maintenance personnel 120 replace the component before it fails, for example, by interacting with a maintenance/work order program 520.

Data storage and retrieval program(s) 514 facilitate the storage and retrieval of data at the light manager's site in database 502.

Network operating system interface program 516 is used to interface with network operation center 106. This interface program is useful, for example, for transmitting data to and receiving data from intelligent luminaire managers 112 installed on the light system manager's equipment.

Data routing program 518 parses and routes data received from network operation center 106.

On the maintenance unit side, there may be included a maintenance work order program 520, an intelligent luminaire manager field unit interface device 522, and an intelligent luminaire manager field unit 524. Also included may be an inventory purchasing program 526 and an asset management program 528.

In an example embodiment, when an alarm or maintenance requirement is sent to the light system manager by network operation center 106, it may be automatically routed to maintenance/work order program 520. This program then automatically generates a work order that can be acted upon by a maintenance worker. An electronic copy of the work order can be downloaded to intelligent luminaire manager field unit 524 via intelligent luminaire manager field unit interface 522.

In an example embodiment, intelligent luminaire manager field unit 524 may be a hand-carried portable device that can be taken on-site while installing and/or servicing a luminaire 200. Information about the installation and/or service is captured by intelligent luminaire manager field unit 524 for subsequent entry into the records of the network operation center 106 or the light system owner/operator 108. Upon return of the maintenance worker to the maintenance unit, the collected information may be uploaded from the field unit into maintenance records. In an embodiment, this uploaded information may be forwarded to network operation center 106 where it is stored and analyzed along with information gathered by maintenance units of other light system owner/operators.

In an embodiment, alarms generated by an intelligent luminaire manager 112 are not cleared until replacement/service information is received at network operation center 106.

In an embodiment, inventory purchasing program 526 keeps track, for example, of stock on hand and causes equipment to be ordered and stocked based on information collected from intelligent luminaire managers 112.

The asset management program 528 is a program that modifies asset management data received, for example, from network operation center 106 to satisfy particular light system owner/operator data requirements.

Based on the description contained herein, it will be appreciated that any or all of the functions and/or functionality described with regards to network operation center 166 can be implemented, for example, by a light system owner/operator 108. Similarly, any or all of the functions and/or functionality described with respect to a light system owner/operator can be implemented by network operation center 106. Thus, the illustration and description of specific functions and functionality residing at a particular location or with a particular entity is illustrative and not intended to limit embodiments of the invention.

FIG. 5B further illustrates intelligent luminaire manager field unit 524. Field unit 524 is used, for example, to activate newly installed or serviced intelligent luminaire managers 112.

In an example embodiment, field unit 524 may include an on-board GPS system 534 and a communications interface 536. The communications interface can communicate, for example, with an intelligent luminaire manager 112 or other device using RF and/or optical communications.

Using the GPS system 534, the field unit 524 may identify the location where an intelligent luminaire manager 112 is installed. This location information may be stored, for example, in memory 320 of intelligent luminaire manager 112. The location information for the installation may also be recorded in the field unit 524, which may be taken back to the maintenance unit and stored in the maintenance unit's records. Alternatively, the location information for the installation may be forwarded to network operation center 106 via the light manager's subscriber/customer interface to network operation center 106.

Other information collected during the installation may include, for example, all the particulars about the equipment monitored and controlled by the intelligent luminaire manager 112 (e.g., lamp type, ballast type, digital photo, etc.). As an example, the lamp type and electrical specifications associated therewith (e.g., voltage and current parameters) may be captured during installation. In an example embodiment, the field unit 524 may include a bar code reader for capturing the additional information that may be stored in a bar code associated with the intelligent luminaire manager 112 or equipment associated therewith. The additional information captured by the field unit 524 may then be later provided for subsequent entry into the records of the network operation center 106 or the light system owner/operator 108. Alternatively, the additional information may be forwarded to network operation center 106 via the light manager's subscriber/customer interface to network operation center 106.

In example embodiments of the invention, for example where more than one intelligent luminaire manager 112 may be installed at the same geographical location (e.g., in a situation where two luminaires are attached to a single pole and each luminaire has its own intelligent luminaire manager 112), field unit 524 can be used to assign a unique identification value to each of the luminaire managers.

Once an intelligent luminaire manager 112 is installed, it self-configures by running a configuration program. Once alive, network 102 notifies network operation center 106, via master controller 114, that a new device has entered the network.

In an example embodiment, field unit 524 is hosted by a PDA 530, running application program(s) 532. Embodiments of the invention are not limited, however, to requiring the use of a PDA. Map base reports downloaded to field unit 524 show the location of each luminaire in a light system and display efficient driving routes for maintenance crews to get to a luminaire requiring repair. Fault types are communicated to crews via network operation center 106 and field unit 524 for pre-diagnostics of a failed luminaire so that time on-site is minimized and the need for return trips to a failed luminaire are eliminated. In an embodiment, the type of faults and corrective actions that can be provided to maintenance crew workers include anticipated lamp cycling, lamp cycling, no starting pulse, starting pulse but failed to start, non-reporting unit, replace lamp when traveling to area, replace lamp, replace starter, check power at fixture, if no power repair power, and if power replace intelligent luminaire manager unit. It will be appreciated this list is illustrative and not intended to limit embodiments of the invention.

During activation of a new intelligent luminaire manager 112, each unit may be identified both in terms of its type of luminaire and its GPS location. This data, coupled with the failure mode reporting, allows for a much greater maintenance crew efficiency. Additionally, dedicated, less-costly maintenance crews are able to conduct all maintenance during daylight hours, rather than nighttime, at significantly lower cost.

In an example embodiment, when an intelligent luminaire manager 112 is removed from service, its identification number may be captured by field unit 524. If the GPS coordinates of the removed intelligent luminaire manager 112 differ from what is expected (e.g., by more than a couple of meters) an alert/alarm may be generated or initiated by field unit 524 and may be provided to network operation center 106. The alarm may be an indication, for example, that (1) the removed intelligent luminaire manager 112 was originally installed improperly (e.g., at the wrong location or with the wrong GPS coordinates); (2) the removed intelligent luminaire manager 112 has been moved since its activation without proper authority; or (3) the data stored by the removed intelligent luminaire manager 112 has been corrupted.

Figure 6:
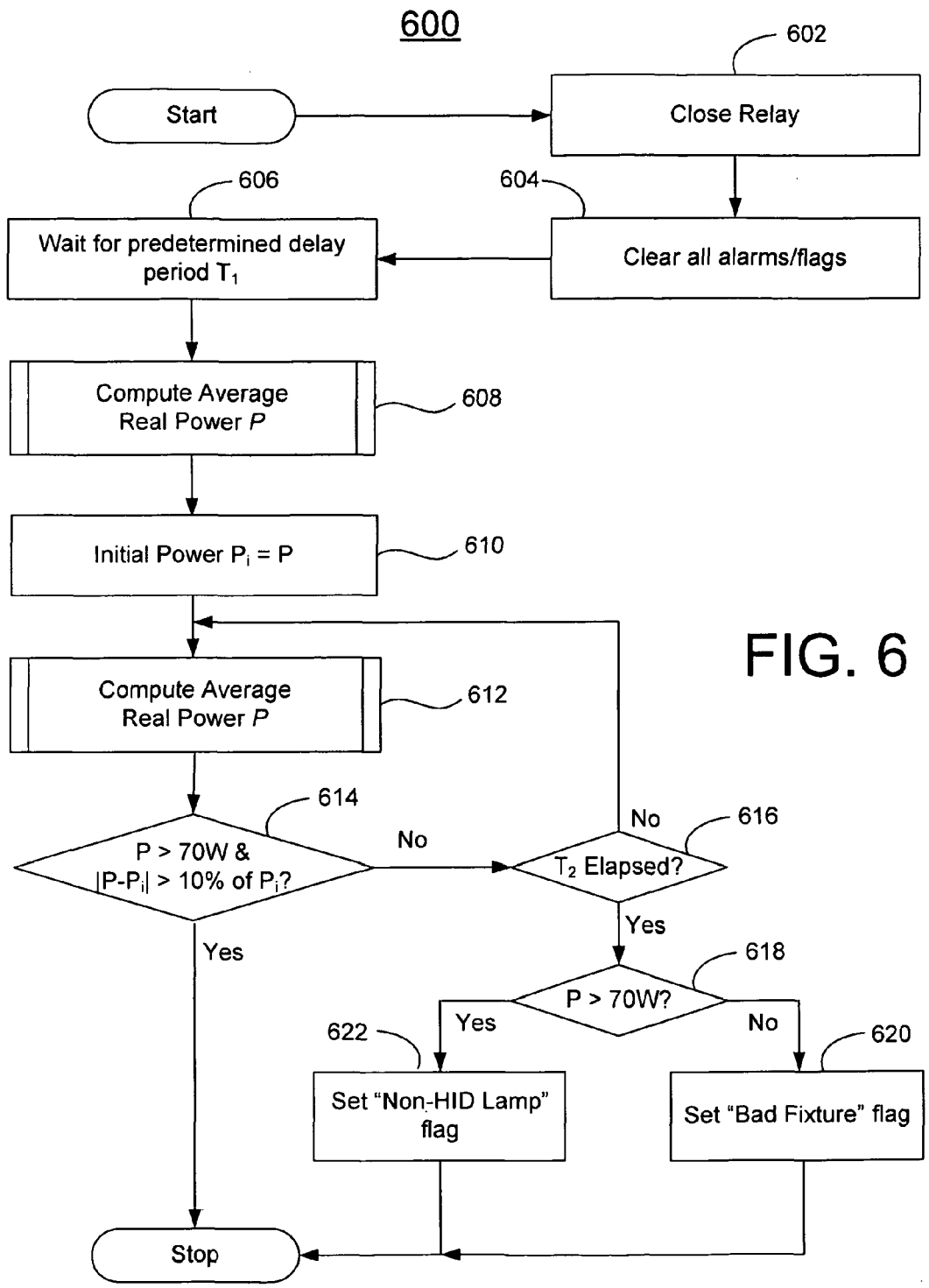
FIG. 6 is a flow chart illustrating the blocks of a diagnostic method for determining a bad fixture, according to an example embodiment of the invention.

According to an example embodiment of the invention, diagnostics such as bad fixture detection and cycling may be performed locally at an intelligent luminaire manager 112. FIG. 6 is a flow chart illustrating the blocks of a diagnostic method 600 for determining a bad fixture, according to an example embodiment of the invention. The diagnostic method 600 may be implemented by embodiments of an intelligent luminaire manager 112. In an example embodiment of the invention, the diagnostic method 600 may operate during an initial start-up phase for a luminaire, according to an example embodiment of the invention.

In block 602, a controller of an intelligent luminaire manager 112 may initially direct that an associated luminaire be provided in an ON state. Accordingly, the controller may provide a directive to close a relay for supplying power to the luminaire. Assuming that the fixture is not bad, the closing of a relay typically results in power being provided to a luminaire, and the luminaire turns on. In block 604, the intelligent luminaire manager 112 may clear any alarms or other flags that are otherwise stored in its memory. In block 606, the intelligent luminaire manager 112 may wait for a predetermined delay period $T_1$ after directing that the relay be closed before proceeding with block 608. In an example embodiment of the invention, the delay period $T_1$ may be 10 seconds, although a shorter or longer time period $T_1$ may also be utilized without departing from example embodiments of the invention. Following the delay period $T_1$, processing proceeds to block 608.

In block 608, the luminaire diagnostics program stored in the memory of the controller may access voltage information from a voltage sensor and current information from a current sensor. The voltage information may be based upon the voltage sensor measuring a voltage provided to a luminaire. The current information may be based upon the current sensor measuring a current provided to the luminaire. The luminaire diagnostics program may calculate the real power using the voltage information and the current information. In an example embodiment of the invention, the real power may be calculated a number of instances over a time period in order to compute an average real power P for the time period. For example, the real power may be calculated once per second for a total of 8 seconds, and the 8 calculated values of the real power may be averaged to provide an average real power P for the past 8 seconds. It will be appreciated that the frequency at which the real power is calculated may be adjusted without departing from example embodiments of the invention. Likewise, the number of real power values included in the average real power P computation may likewise be adjusted without departing from example embodiments of the invention.

In block 610, the average real power P calculated in block 608 that was determined shortly after directing that the relay be closed may be saved for later use as the initial Power $P_1$. In block 612, an average real power P for a subsequent time period may be calculated. For example, similar to the calculation in block 608, the real power may be calculated once per second for a total of 8 seconds, and the 8 calculated values of the real power may be averaged to provide an average real power P for the past 8 seconds. It will be appreciated that the frequency in which the real power is calculated and the number of real power values included in the average real power P computation may be varied in accordance with example embodiments of the invention.

Following block 612, processing may proceed to block 614. In block 614, the present average real power P is compared to a bad fixture threshold. In an example embodiment of the invention, the bad-fixture threshold may be set at around 70W; however, the bad fixture threshold may be set depending on the type of luminaire installed. In an example embodiment of the invention, the bad fixture threshold may be set at a real power level that would be indicative of a bad fixture. Accordingly, block 614 may determine whether the present average real power P is greater than the bad-fixture threshold (e.g., 70W). It will be appreciated that while a luminaire (e.g., having a high-intensity discharge (HID) lamp) is still in a start-up process, there may not necessarily be a bad fixture even if the present average real power P is less than the bad-fixture threshold. Thus, block 614 also determines whether the present average real power P is still increasing. As an example, block 614 may determine whether the magnitude between the present average real power P and the initial Power $P_i$ is greater than a particular power threshold (e.g., 10% of the initial Power $P_i$).

If block 614 determines that the current average real power P is greater than the bad-fixture threshold (e.g., 70W) and the magnitude between the present average real power P and the initial Power $P_i$ is greater than a particular power threshold (e.g., 10% of the initial power $P_i$), then there may not be any bad fixture determined by diagnostic method 600. On the other hand, if either the average real power P is greater than the bad-fixture threshold (e.g., 70W) or the magnitude between the average real power P and the initial Power $P_i$ is less than a particular power threshold (e.g., 10% or another percentage of the initial power $P_i$), then processing may proceed to block 616.

Block 616 may also determine whether a second delay period $T_2$ (e.g., 10 minutes) has elapsed since the controller directed that the relay be closed to supply power to the luminaire. It will be appreciated that the second delay period $T_2$ may be set at 10 minutes or another time period that is sufficient for determining whether or not the fixture is a bad fixture, according to an example embodiment of the invention. If block 616 determines that the second delay period $T_2$ has not elapsed, then processing may return to blocks 612 and 614 to determine whether the bad-fixture threshold or power threshold are now met. On the other hand, if block 616 determines that the second time period has elapsed, then processing may proceed to block 618. Block 618 may determine whether the present average real power P is greater than the bad-fixture threshold (e.g., 70W). If so, then block 622 may determine that there is a Non-HID lamp installed, and a "Non-HID Lamp" alarm or flag may be set. On the other hand, if block 618 determines that the present average real power P is less than the bad-fixture threshold (e.g., 70W), then processing may proceed to block 620. In block 620, a "bad fixture" alarm or flag may be set. The alarm or flag that is set in block 620 or 622 may be transmitted in a message by an intelligent luminaire manager 112 via network 102 to the network operation center 106. The network operation center 106 may provide the received alarm, flag, or other status information to the light system owner/operators 108 and/or maintenance personnel.

Figure 7:
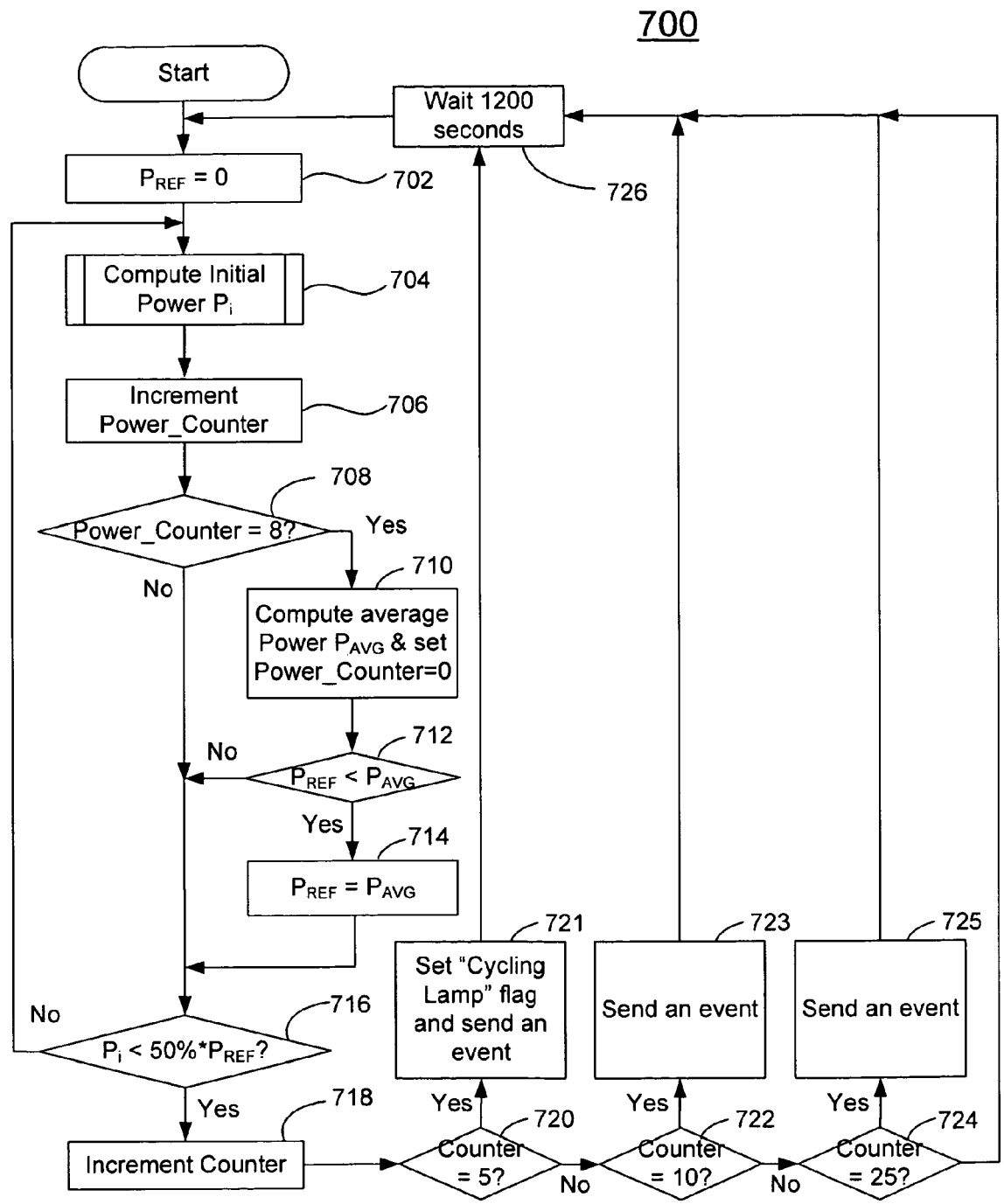
FIG. 7 is a flow chart illustrating the blocks of a diagnostic method for determining cycling of a luminaire, according to an example embodiment of the invention.

FIG. 7 is a flow chart illustrating the blocks of a diagnostic method 700 for determining cycling of a luminaire, according to an example embodiment of the invention. The diagnostic method 700 may be implemented by embodiments of an intelligent luminaire manager 112. In an example embodiment of the invention, the diagnostic method 700 may be utilized following a predetermined delay after directing the closure of the relay or following the operation of the diagnostic method 600 of FIG. 6.

In block 702, a luminaire diagnostics program stored in a memory of the controller of an intelligent luminaire manager 112 may initialize (e.g., set to zero) or reset a reference power $P_{REF}$ value stored in a memory. In block 704, the luminaire diagnostics program may access or receive voltage information from a voltage sensor and current information from a current sensor. The luminaire diagnostics program may calculate the current power P, using the voltage information and current information. In block 706, the luminaire diagnostics program may increment a Power Counter that is stored in the memory. The Power Counter may be utilized by the luminaire diagnostics program to determine when to calculate an average power $P_{AVG}$ for use in adjusting a value of the reference power $P_{REF}$ value.

Block 708 may determine whether the Power Counter has reached a predetermined value (e.g., Power_Counter=8?). If so, then processing may proceed to block 710. In block 710, the luminaire diagnostic program may determine the current average power $P_{AVG}$. In addition, in block 710, the Power Counter may be reset. In block 712, the luminaire diagnostic program may determine whether the current average power $P_{AVG}$ is greater than the reference power $P_{REF}$ value. If so, then processing may proceed to block 714, where the reference power $P_{REF}$ value may be set to be the current average power $P_{AVG}$ computed in block 710. The new reference power $P_{REF}$ value may then be utilized in the comparison of block 716.

In block 716, the luminaire diagnostic program may make a determination as to whether the current power P, value is less than a predetermined amount (e.g., 50%, a range of between 40%-60%, etc.) of the reference power $P_{REF}$ value or another threshold value. If block 716 determines that the current power P, value is greater than a predetermined amount (e.g., 50%) of the reference power $P_{REF}$ value or other threshold value, then processing may return to block 704. On the other hand, if block 716 determines that the current power $P_i$ value does not exceed a predetermined amount (e.g., 50%) of the reference power $P_{REF}$ value or other threshold value, then processing may proceed to block 718. In block 718, the luminaire diagnostic program may increment a cycling condition counter that indicates that a potential cycling fault has been detected. It will be appreciated the cycling condition counter may have been incremented each time that the diagnostic method 700 has detected a cycling condition. Once the cycling condition counter has reached one or more thresholds within a time period, then an actual alarm or flag may be set in a memory by the luminaire diagnostic program, and a cycling event may also be transmitted in message by intelligent luminaire manager 112 via network 112 to the network operation center 106. For example, in block 720 if the cycling condition counter reaches a first predetermined threshold (e.g., 5), then processing proceeds to block 721, where a "Cycling Lamp" alarm or flag is set, and a cycling event indicating a cycling fault may be transmitted via network 112 to the network operation center 106. In addition, if the cycling condition counter reaches a second predetermined threshold (e.g., 10) in block 722, then processing may proceed to block 721, and another event indicating a cycling fault may be transmitted via network 112 to the network operation center 106. Further, if the counter reaches a third predetermined threshold (e.g., 25) in block 724, then processing may proceed to block 721, and another event indicating a cycling fault may be transmitted to the network operation center 106 via the network 102. The network operation center 106 may provide the received alarm, flag, or other status information to the light system owner/operators 108 and/or maintenance personnel. It will also be appreciated that a network owner may determine the threshold number of cycling condition counts that must be accumulated before a "cycling lamp" alarm or flag is set or an event is transmitted via network 112 to the network operation center 106. For example, one network owner may not be concerned with less than 10 cycles in a 24-hour period, while another network owner may find that 5 cycles in a 24-hour period is unacceptable. Accordingly, one or more of blocks 720/721, 722/723, and 724/725 may not necessarily be available in accordance with other example embodiments of the invention. Many variations of these thresholds are available in accordance with example embodiments of the invention. Following blocks 721, 723, and 725, processing may proceed to block 726, where a certain delay period (e.g., 1200 seconds) may be implemented before the diagnostic method 700 attempts to identify additional cycling conditions of the luminaire.

Figure 8A:
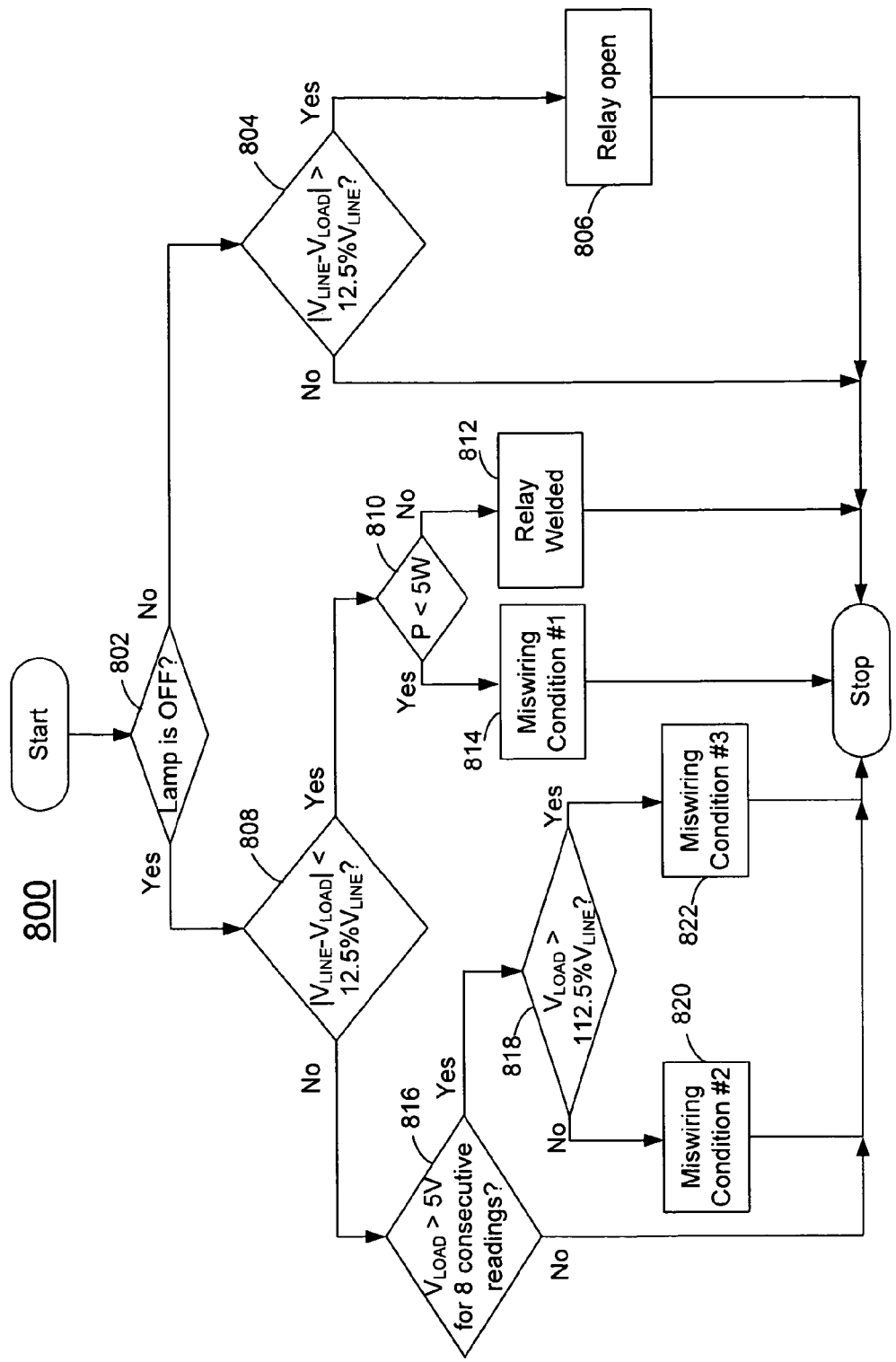
FIG. 8A is a flow chart illustrating the blocks of a diagnostic method for a wire check algorithm, according to an example embodiment of the invention.

FIG. 8A is a flow chart illustrating the blocks of a diagnostic method 800 for a wire check algorithm, according to an example embodiment of the invention. The diagnostic method 800 may be implemented by embodiments of an intelligent luminaire manager 112. The diagnostic method 800 may be performed by the intelligent luminaire manager 112 based upon a input line voltage $V_{LINE}$, a measured output load voltage $V_{LOAD}$ associated with a luminaire, and a power P being drawn by the luminaire. It will be appreciated that the input line voltage $V_{LINE}$ and the load voltage $V_{LOAD}$ may be received by the intelligent luminaire manager 112 from voltage sensors, according to an example embodiment of the invention. For example, load voltage $V_{LOAD}$ may be determined by a voltage sensor measuring a voltage from a load leg of a luminaire to neutral. Alternatively, the load voltage load voltage $V_{LOAD}$ may be determined by a voltage sensor measuring a voltage across the relay the supplies power to the luminaire. In addition, the intelligent luminaire manager 112 may determine a current (I) being provided to a luminaire, and the power P being drawn by the luminaire may be computed, according to an example embodiment of the invention. In an example embodiment of the invention, every time when $V_{LINE}$, $V_{LOAD}$, I is read, and P is computed, the diagnostic method 800 may be performed by the luminaire diagnostics program of the intelligent luminaire manager 112, except perhaps after a predetermined amount of time (e.g., 10 seconds) after the relay is directed to change states.

Block 802 may determine whether the luminaire is expected to be in an OFF command state. In an example embodiment of the invention, the intelligent luminaire manager 112 may determine whether the luminaire is expected to be in an OFF command state based upon information received from a photo-detector or other photocell device. In an example embodiment of the invention, if a threshold level of daylight is detected by the photo-detector or photocell device, then the intelligent luminaire manager 112 may determine that the luminaire is expected to be in an OFF command state.

If the luminaire is not expected to be in an OFF command state in block 802—that is, the luminaire is expected to be in an ON command state, then processing may proceed to block 804. Block 804 may determine whether not substantially equal voltages are detected between the line voltage $V_{LINE}$ and the load voltage $V_{LOAD}$. Indeed, substantially equal voltages between the line voltage $V_{LINE}$ and the load voltage $V_{LOAD}$ may be expected when the luminaire is actually ON. For example, block 804 may include determining whether a magnitude of the difference between the $V_{LOAD}$ and $V_{LINE}$ is greater than a threshold value. As an example, the threshold value may be set as a percentage (e.g., 12.5%) of the line voltage $V_{LINE}$. If block 802 determines that the line voltage $V_{LINE}$ is not substantially equal to the load voltage $V_{LOAD}$, then processing may proceed to block 806, where the relay is determined to be open. Otherwise, block 804 may finish without any error state being detected.

On the other hand, if the luminaire is expected to be in an OFF command state in block 802, then processing may proceed to block 808. Block 808 may determine whether substantially unequal voltages are detected between the line voltage $V_{LINE}$ and the load voltage $V_{LOAD}$. Indeed, substantially unequal voltages between the line voltage $V_{LINE}$ and the load voltage $V_{LOAD}$ may be expected when the luminaire is actually OFF. For example, block 804 may include determining whether a magnitude of the difference between the load voltage $V_{LOAD}$ and the line voltage $V_{LINE}$ is less than a threshold value. As an example, the threshold value may be set as a percentage (e.g., 12.5%) of the line voltage $V_{LINE}$.

If block 808 determines that substantially unequal voltages are detected between the line voltage $V_{LINE}$ and the load voltage $V_{LOAD}$, then a potential condition may be present, and processing may proceed to block 810. Block 810 may determine whether the power P drawn by the luminaire is less than a threshold amount (e.g., 5W). If the power P drawn by the luminaire is less than a threshold amount, then processing may proceed to block 814, where a miswiring condition #1 is detected, as illustrated by FIG. 8B. With the miswiring condition #1, the luminaire may be connected to power supply line L2 instead of the Neutral N. On the other hand, if the power P drawn by the luminaire is greater than the threshold amount, then processing may proceed to block 812, where a welded relay condition is determined. A welded relay condition may result in the relay remaining closed even when instructed to open.

On the other hand, block 808 may determine that substantially unequal voltages are not detected between the line voltage $V_{LINE}$ and the load voltage $V_{LOAD}$. In this case, processing may proceed to block 816. Block 816 may include determining whether the load voltage $V_{LOAD}$ is greater than a threshold amount (e.g., 5V) for a predetermined number of readings (e.g., 8 consecutive readings over a predetermined period of time). If not, then a potential condition may be present and processing may proceed to block 818. Block 818 may determine whether the load voltage $V_{LOAD}$ exceeds a predetermined amount (e.g., 112.5%) of the line voltage $V_{LOAD}$ or another threshold amount. If not, then miswiring condition #2 is detected in block 820, as illustrated in FIG. 8B. Otherwise, miswiring condition #3 is detected in block 822, as also illustrated in FIG. 8B. With miswiring condition #2, the intelligent luminaire manager 112 may be connected to the second power supply line L2 instead of neutral. With miswiring condition #3, the luminaire may be connected to the second supply line L2 instead of neutral N. In addition, the installed positions of the neutral N and first power supply line L1 for the intelligent luminaire manager 112 may be swapped. According to an example embodiment of the invention, the detected conditions in blocks 806, 812, 814, 820, and/or 822, or other detected status, may be transmitted in a message by an intelligent luminaire manager 112 to the network operation center 106 via network 102.

It will be appreciated that the diagnostic methods disclosed in FIGS. 6, 7, and 8A-B have been provided for illustrative purposes and that other diagnostic methods may be provided by the intelligent luminaire manager 112.

As an example, another diagnostic method may include determining high-current levels or low-current levels being provided or drawn by a luminaire or other device. High-current levels may be indicative of equipment malfunction such as a malfunction with a ballast. In an example embodiment, a current sensor may provide the intelligent luminaire manager 112 with information regarding current levels (e.g., instantaneous current level, averaged current level) being provided or drawn by the luminaire or other device (e.g., a load current). The current level may then be compared to one or more thresholds, which may include a nominal expected current level (e.g., 10A), a maximum current level (e.g., 15A), a low current level (e.g., 5A), or another desired current threshold. If the current level exceeds one or more threshold values, then the intelligent luminaire manager 112 may generate a high-current alarm event or status. If the instantaneous current level is lower than one or more threshold values, then the intelligent luminaire manager 112 may generate a low-current alarm event or status. The generated alarm event or status may be transmitted to the network operation center 106 via the network 102. The network operation center 106 may provide the received alarm event or status information to the light system owner/operators 108 and/or maintenance personnel.

It will also be appreciated that while FIGS. 6, 7, and 8A-B have described diagnostic methods that may be performed by an intelligent luminaire manager 112, other diagnostic methods may be performed at a system-level. Indeed, system-level diagnostics such as fixture malfunction or day burning can also be performed remotely at a network operation center 106 based upon (i) operational and/or event information received from an intelligent luminaire manager 112 and (ii) activation information or other operational information acquired during installation of an intelligent luminaire manager 112 or associated equipment/fixture/luminaire, perhaps received from a field unit 122, 524. Examples of operational information received by the network operation center 106 from an intelligent luminaire manager 112 may include information, perhaps transmitted periodically (e.g., hourly) or in conjunction with one or more reported events, relating to supplied or utilized current (I) and voltage (V) information associated with operation of the luminaire. Examples of activation information may include the type/identification of the lamp installed in the luminaire (e.g., HID lamp, non-HID lamp, LED lamp), the luminaire itself, and operating specifications associated with the installed luminaire, including power, current, and/or voltage specifications. The activation information may be obtained using a PDA-hosted field unit, as described herein. If the activation information specifies the type/identification of the installed luminaire, but perhaps not the actual desired operating specification, then the network operation center 106 may use the type/identification information to determine the desired operating specification (e.g., perhaps provided by the manufacturer or another source) associated therewith.

It will be appreciated that the network operation center 106 may receive and store operational information received from the intelligent luminaire managers 112. The storage of the operational information at the network operation center 106 may reduce the amount of data that needs to be stored by the intelligent luminaire manager 112, according to example embodiment of the invention. In addition, the stored historical operational information may be utilized by the network operation center 106 in performing additional diagnostics or analyses.

Figure 9:
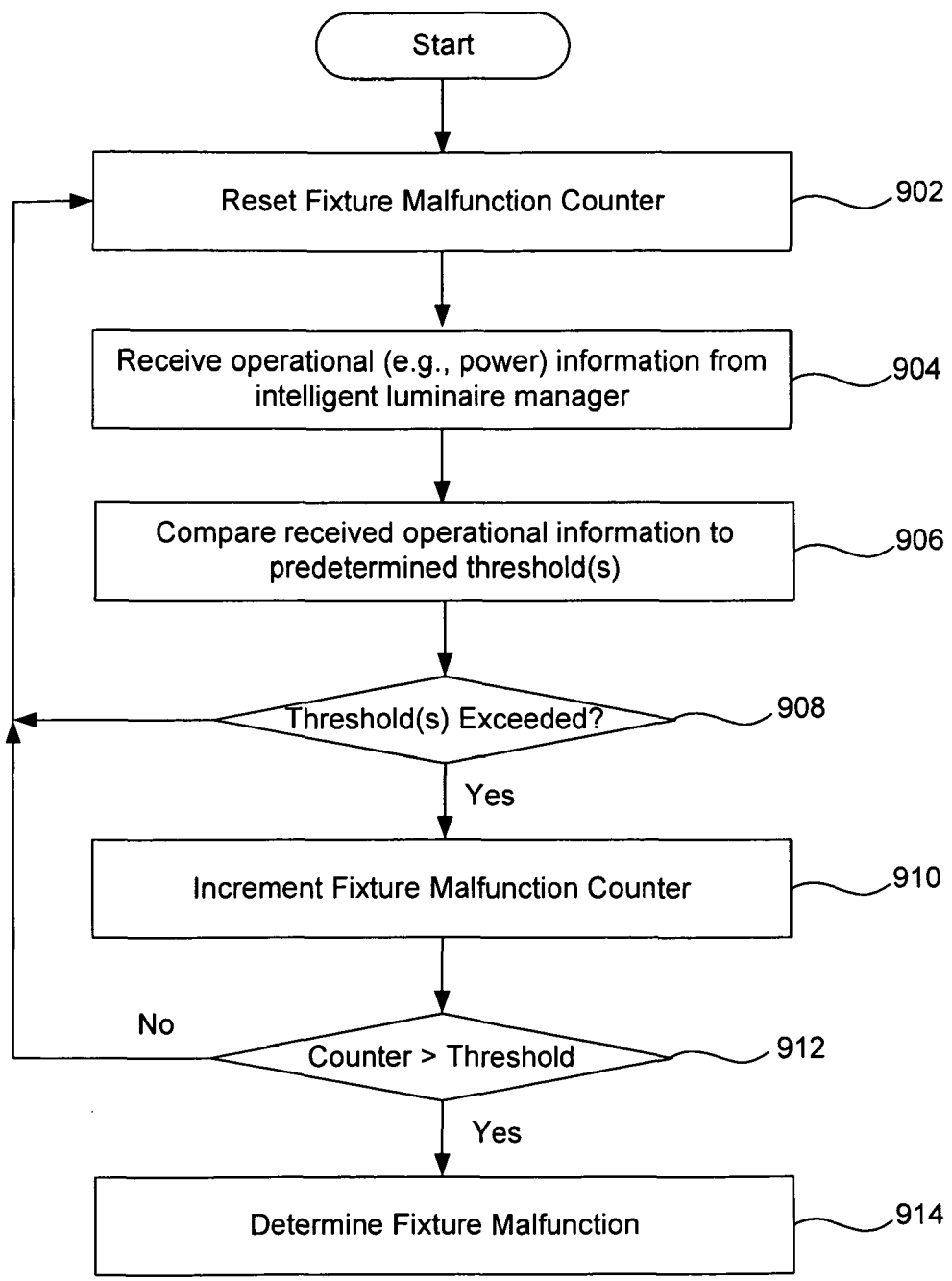
FIG. 9 is a flow chart illustrating the blocks of a diagnostic method for determining a fixture malfunction, according to an example embodiment of the invention.

FIG. 9 is a flow chart illustrating the blocks of a diagnostic method 900 for determining a fixture malfunction, according to an example embodiment of the invention. The diagnostic method 900 may be implemented by embodiments of a network operation center 106. In block 902, a fixture malfunction counter may be reset (e.g., set to zero). The fixture malfunction counter may generally track a number of possible detected fixture malfunction incidents during a period of time. The fixture malfunction counter may be reset periodically, in accordance with a schedule, or on request. In block 904, the network operation center 106 may receive operational information from an intelligent luminaire manager 112 or other RF device, including information regarding current, voltage, and/or power levels drawn by or supplied during operation of the luminaire or other equipment.

In block 906, at least a portion of the received operational information may be compared to one or more predetermined thresholds. In an example embodiment of the invention, the one or more predetermined thresholds may be based upon activation information obtained during installation and activation of an intelligent luminaire manager 112 or other RF device. Indeed, a maintenance worker may store the activation information in the handheld unit 122, 524 for subsequent delivery to and storage at the network operation center 106. For example, a maintenance worker may be manually enter the information into the handheld unit 122, 524, or perhaps otherwise provide the information to the handheld unit 122, 524 by scanning a bar code either on the installed equipment (e.g., a luminaire) or elsewhere to identify the installed equipment or a specification associated with the installed equipment. Alternatively, the activation information may be transmitted in a message from the intelligent luminaire manager 112 or other RF device to the to the network operation center 106 via the network 102.

In an example embodiment of the invention, the activation information may specify a type or identification of an installed luminaire or other equipment. The activation information may also include electrical specifications, including expected operating specifications (e.g., power, current, and/or voltage operating specifications) of the installed luminaire or other equipment. Alternatively, if the activation information a type or identification of an installed luminaire or other equipment, the network operation center 106 may be able to determine the associated operating specifications (e.g., electrical specifications), perhaps based upon manufacturer specifications or ANSI specifications.

As introduced above, in block 906, at least a portion of the received operational information may be compared to one or more predetermined thresholds that may be determined based upon the activation information. It will also be appreciated that the one or more predetermined thresholds may vary depending on whether the luminaire or other equipment is operating in an ON or OFF command state. In an example embodiment of the invention, received power information associated with operation of the installed luminaire or other equipment may be compared to the expected power operating specification based upon the received activation information. In another example embodiment, the received current or voltage information may be compared to the expected current or voltage operating specifications based upon the received activation information.

In block 908, the network operation center 106 may determine whether one or more operating specifications or thresholds in block 906 have been exceeded (or exceeded by an impermissible threshold amount or percentage). If one or more operating specifications or thresholds have been exceeded, then the luminaire may be operating out of specifications, and processing may proceed to block 910. In block 910, the fixture malfunction counter may be incremented to signify that a potential fixture malfunction incident has been detected.

In block 912, if the fixture malfunction counter is greater than a threshold amount within a time period, then processing may proceed to block 914. It will be appreciated that the threshold amount in block 912 may be set based upon input from the light system owner/operators 108 or another entity. In block 914, the network operation center 106 may determine that there is a fixture malfunction or other operational status. The network operation center 106 may then generate an equipment status based at least in part on the determined fixture malfunction or other operational status. The system owner/operators 108 and/or maintenance personnel may be notified of the fixture malfunction or other operational status, as described herein. In an example embodiment of the invention, the determined fixture malfunction or other operational status may be included in a work order report, as also described herein.

According to an example embodiment of the invention, the diagnostics method 900 may be utilized to determine excessive power consumption by a luminaire or other device. For example, the network operation center 106 may receive operational information from the intelligent luminaire manager 112 or other RF device, including current, voltage, and/or power level information associated with the luminaire. The network operation center 106 may determine the power consumption associated with the luminaire or other device and compare the power consumption to nominal expected power level for the luminaire or other device plus a threshold value. If the power consumption associated with the luminaire or other device exceeds the nominal expected power levels plus the threshold value, then the network operation center 106 may determine an operational status associated with excessive power consumption. The network operation center 106 may then generate an indication or other message identifying the excessive power consumption. Indeed, the system owner/operators 108 and/or maintenance personnel may be notified of the excessive power consumption, as described herein. In an example embodiment of the invention, the determined excessive power consumptions status of the luminaire may be included in a work order report, as also described herein.

Figure 10:
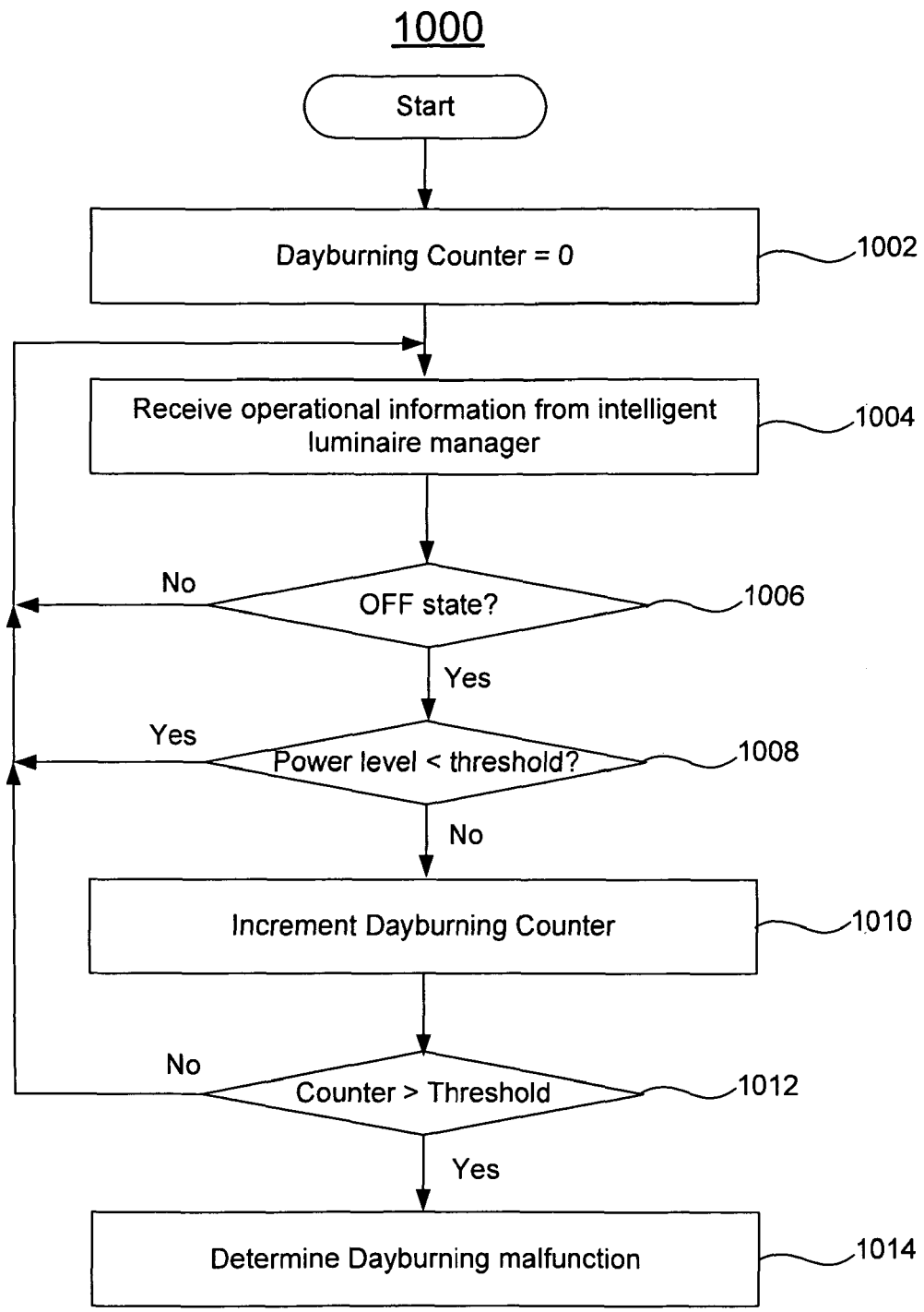
FIG. 10 is a flow chart illustrating the blocks of a diagnostic method 1000 for determining a dayburning malfunction, according to an example embodiment of the invention.

FIG. 10 is a flow chart illustrating the blocks of a diagnostic method 1000 for determining a dayburning malfunction, according to an example embodiment of the invention. The diagnostic method 1000 may be implemented by embodiments of a network operation center 106.

In block 1002, a dayburning counter may be reset (e.g., set to zero). The dayburning counter may generally track a number of possible detected dayburning incidents during a period of time. The dayburning counter may be reset periodically or in accordance with a schedule. In block 1004, the network operation center 106 may receive operational information from an intelligent luminaire manager 112, including information regarding current, voltage, and/or power levels drawn by or otherwise associated with operation of the luminaire.

In block 1006, the network operation center 106 may determine whether the received operational information indicates that intelligent luminaire manager 112 is operating in an OFF state. If so, then the luminaire is likewise expected to be off, and the network operation center 106 may proceed to block 1008 to determine whether a dayburning condition associated with the luminaire is present. According to an example embodiment, block 1008 may determine whether the luminaire is still drawing more than an insignificant power level when the intelligent luminaire manager 112 is operating in an OFF state. Accordingly, block 1008 may include determining whether the power level drawn by the luminaire exceeds a maximum threshold amount (e.g., a threshold between 0W-2W). The maximum threshold amount may be adjusted in accordance with an example embodiment of the invention If block 1008 determines that the luminaire is still drawing more than an insignificant power level when the intelligent luminaire manager 112 is operating in an OFF state, then processing may proceed to block 1010. In block 1010, the dayburning counter may be incremented to signify that a potential dayburning incident has been detected.

In block 1012, if the dayburning counter is greater than a threshold amount within a time period, then processing may proceed to block 1014. The threshold amount in block 1012 may be set based upon input from the light system owner/operators 108 or another entity. In block 1014, the network operation center 106 may determine that there is a dayburning malfunction. The system owner/operators 108 and/or maintenance personnel may be notified of the dayburning malfunction, as described herein. In an example embodiment of the invention, the determined dayburning malfunction may be included in a work order report, as also described herein.

It will be appreciated that system-level diagnostics at the network operation center 106 may also utilize system-level information in performing the diagnostics. For example, information received from adjacent intelligent luminaire managers 112 or RF devices may be utilized to determine whether a condition detected by a particular intelligent luminaire manager 112 or RF device is the result of a local problem, or whether there is a system-level problem such as a blackout or a power transmission quality issue.

In an example embodiment of the invention, the network operation center 106 may also diagnose communication problems associated with the intelligent luminaire manager 112 or other RF device. According to an example embodiment of the invention, the network operation center 106 may expect to receive periodic reports, messages, or events/alarms from an intelligent luminaire manager 112 or other RF device. For example, during normal operation, the intelligent luminaire manager 112 or other RF device may transmit periodic reports with voltage and current information associated with the monitored equipment to the network operation center 106. Likewise, the intelligent luminaire manager 112 or other RF device may likewise transmit messages to the network operation center 106 when there is a change in operational state (e.g., ON, OFF, etc.) or other status. Similarly, an alarm or event may be transmitted from the intelligent luminaire manager 112 or other RF device to the network operation center on a priority basis as well. Accordingly, the network operation center 106 may determine that an intelligent luminaire manager 112 or other RF device is experiencing a communication problem where the network operation center 106 does not receive any communication (e.g., periodic reports, status messages, events/alarms, etc.) from the intelligent luminaire manager 112 or other RF device for a predetermined period of time (e.g., 2 days, 4 days, etc.). In an example embodiment of the invention, the lack of communications from an intelligent luminaire manager 112 or other RF device may be classified, prioritized, or grouped by the network operation center 106 according to duration of the lack of communications. For example, low-priority no-communication problems may be associated with a lack of communications for less than 24 hours. Medium-priority communication problems may be associated with lack of communications for between 24 hours and 48 hours. High-priority communication problems may be associated with lack of communications for over 48 hours. Many variations in the classifications, prioritizations, and grouping may be available in accordance with example embodiments of the invention. System owner/operators 108 and/or maintenance personnel may be notified of some or all of the communication problems.

According to another example embodiment, the network operation center 106 may also diagnose system-level communication problems associated with a plurality of intelligent luminaire managers 112 or other RF devices. In an example embodiment of the invention, the network operation center 106 may initially determine individual communication problems for a plurality of intelligent luminaire managers 112 or other RF devices, as described above. The network operation center 106 can then analyze the plurality of intelligent luminaire managers 112 or RF devices having communication problems to determine whether a system-level problem can be determined. Examples of system-level problems may include network system failures or power distribution failures. As an example, if at least a certain number (e.g., a minimum of 3 or 4) of intelligent luminaire managers 112 or RF devices within a predetermined distance (e.g., 400-500 ft radius) or other geographic location all have communication problems with an overlapping period of time (e.g., the same hour), then the network operation center 106 may determine that there is a system-level problem. In an example embodiment of the invention, the network operation center 106 may notify a utility company, system owner/operators 108, maintenance personnel, and/or another entity of the determined system-level problem.

In yet another example embodiment of the invention, an intelligent luminaire manager 112 or RF device may have a back-up power source such as a battery. Accordingly, the intelligent luminaire manager 112 or RF device may still be operative for a limited time if the primary power (e.g., a line voltage) fails. In an example embodiment of the invention, if the intelligent luminaire manager 112 or RF device loses primary power, then the intelligent luminaire manager 112 or RF device may transmit a no-power alarm to the network operation center 106 via the network 102. In an example embodiment of the invention, the network operation center 106 may receive a plurality of no-power alarms from a respective plurality of intelligent luminaire managers 112 or RF devices. The network operation center 106 can then analyze the plurality of no-power alarms according to geographical location and time of failure. As an example, if the network operation center 106 determines that a predetermined number of intelligent luminaire managers or RF devices within a predetermined distance (e.g., 400-500 ft radius) or other geographic location all have non-power alarms with an overlapping period of time (e.g., the same hour), then the network operation center 106 may determine a mass power outage or other system-level problem. In an example embodiment of the invention, the network operation center 106 may notify a utility company, system owner/operators 108, maintenance personnel, and/or another entity of the determined system-level problem.

In addition to the communications diagnostics described above, the network operation center 106 may also be operative to perform system-level diagnostics relating to power and distribution. According to an example embodiment of the invention, the network operation center 106 may be able to identify equipment or fixtures that operate on group control. With group control, a plurality of equipment or fixtures such as luminaires may be similarly operated in a group using a single photo-control, timer, relay, or other control device. However, it may not be desirable to use group control when a respective intelligent luminaire manager 112 or other RF device has been provided for or is communication with a respective equipment, fixture, or a luminaire.

In diagnosing a group control configuration, the network operation center 106 may compare the reports or messages received from the intelligent luminaire managers 112 or other RF device during a time period (e.g., a day) against expected reports or messages. For example, if the network operation center 106 consistently (e.g., greater than 3 days in a row or some other time period) receives reports or messages (e.g., hourly reports) from a first intelligent luminaire manager 112 or RF device during a first time period (e.g., each night), but none during a second time period (e.g., during daylight)—that is, there is no communications during the second time period, then the network operation center 106 may determine that a first equipment, fixture, or luminaire associated with the first intelligent luminaire manager or RF device is potentially on a group control configuration. In addition, the network operation center 106 may also determine, based upon the received reports from at least one second intelligent luminaire manager 112 or RF device, that at least one second equipment, fixture, or luminaire in the proximity of the first equipment, fixture, or luminaire is operating in a similar pattern or schedule (e.g., communications during night, but none during the day) as the first equipment, fixture, or luminaire. In this situation, the network operation center may determine that the first equipment, fixture, or luminaire and the at least one second equipment, fixture, or luminaire that are in proximity to each other are in a group control configuration. In an example embodiment of the invention, the network operation center 106 may notify a system owner/operator 108 or maintenance personnel of the group control configuration, and a location of the equipment, fixtures, or luminaires associated therewith.

According to an example embodiment of the invention, the network operation center 106 may also be operative to diagnose a power distribution quality problem. The network operation center 106 may receive periodic reports or messages (e.g., 30-minute reports, hourly reports, etc.) from an intelligent luminaire manager 112 or other RF device. The periodic reports or messages may include voltage information, including a line voltage detected by a voltage sensor of the intelligent luminaire manager 112 or other RF device. The network operation center 106 may then record the received voltage information (e.g., line voltage) in association with a time (e.g., approximate time the voltage information was measured or received). Based upon the received voltage information, the network operation center 106 may determine if the received voltage (e.g., line voltage) is too high (e.g., exceeds a first threshold) or too low (e.g., is below a second threshold). The thresholds for determining a high or low voltage condition may be set by an entity such as the owner/operator 108 or otherwise determined based upon the activation information, as described herein. A high voltage condition or a low voltage condition may be recorded by the network operation center 106.

In addition, since the network operation center 106 records the voltage information received from the intelligent luminaire manager 112 during a plurality of time periods, the network operation center 106 can also determine whether the change in voltage is acceptable. For example, the network operation center 106 may calculate a change in line voltage $V_{LINE}$ between the high and lowest line voltages for a one-hour period or another period. If the change in line voltage $V_{LINE}$ exceeds a maximum acceptable amount or threshold, then the network operation center may determine a power quality problem. In an example embodiment of the invention, the network operation center 106 may notify a system owner/operator 108 or maintenance personnel of the power quality problem and/or detected high voltages or low voltages.

In addition, the network operation center 106 may also leverage system-level knowledge of power quality problems associated with a plurality of intelligent luminaire managers 112 or RF devices, or fixtures or equipment in communications with the luminaire mangers 112 or RF devices. In particular, if the power quality problems arise in a confined geographical area or are other provided in a particular groupings or configuration (or within a predetermined distance) within a substantially same or overlapping time period, then the network operation center may be able to diagnose or detect a power distribution quality problem on a particular branch circuit or confined geographical area.

It will be appreciated that the aforementioned diagnostics and yet other diagnostics may be performed by the network operation center 106. In addition, while the example diagnostics may have been discussed in the context of an intelligent luminaire manager 112 monitoring a luminaire, the example diagnostics are applicable generally to many RF devices in communications with equipment. The RF devices may utilize a network similar to the network (e.g., mesh network, etc.) formed by the networked intelligent luminaire managers described herein. Alternatively, the RF devices may join the network of networked intelligent luminaire managers, as described herein. Example equipment in communication with or otherwise monitored by the RF device may include utility equipment such as gas, electric, water meters, parking maters, or yet other meters. Other example equipment is available without departing from example embodiments of the invention.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed is:

1. An intelligent luminaire manager, comprising:
    a voltage sensor for measuring a voltage provided to a luminaire; a current sensor for measuring a current provided to the luminaire;
    a controller configured to receive voltage information corresponding to the voltage measured by the voltage sensor and current information corresponding to the current measured by the current sensor;
    a luminaire diagnostic program stored in a memory of the controller, wherein the luminaire diagnostic program is operative to:
        compute a first average real power based upon the received voltage information and the received current information for a first time period;
        compute a second average real power based upon the received voltage information and the received current information for a second time period subsequent to the first time period;
        determine whether the second average real power has increased beyond the first average real power by at least a preset amount; and
        generate a fixture status indication associated with the luminaire based upon the determination.

2. The intelligent luminaire manager of claim 1, wherein the preset amount is a percentage of the computed initial average real power.

3. The intelligent luminaire manager of claim 1, wherein the second average real power is determined to not have increased beyond the initial average real power by the preset amount, and wherein the luminaire diagnostic program is further configured to: determine that the second average real power does not exceed a threshold value, wherein the fixture status indication is set to indicate a bad fixture.

4. The intelligent luminaire manager of claim 1, wherein the second average real power is determined to not have increased beyond the initial average real power by the preset amount, and wherein the luminaire diagnostic program is further configured to:
    determine that the second average real power exceeds a threshold value, wherein the fixture status indication is set to indicate an installation of a non-HID (high-intensity discharge) lamp.

5. The intelligent luminaire manager of claim 1, wherein the first time period begins after a predetermined delay period following a directive from the controller to turn on the luminaire.

6. The intelligent luminaire manager of claim 1, wherein the generated fixture status is wirelessly transmitted to a network server via a network of networked intelligent luminaire managers.

7. The intelligent luminaire manager of claim 1, wherein the initial average real power or the second average real power value is computed based at least in part upon by averaging a plurality of instantaneous real power values, wherein each instantaneous real power value is determined from a product of a voltage value and a current value, wherein the voltage value is included in the received voltage information and the current value is included in the received current information.

8. The intelligent luminaire manager of claim 1, wherein the determination of whether the second average real power has increased beyond the first average real power value by at least the preset amount comprises:
    calculating a magnitude of a difference between the second average real power and the first average real power; and
    comparing the calculated magnitude to the preset amount.

9. An intelligent luminaire manager, comprising:
    a voltage sensor for measuring a voltage provided to a luminaire;
    a current sensor for measuring a current provided to the luminaire;
    a controller configured to receive voltage information corresponding to the voltage measured by the voltage sensor and current information corresponding to the current measured by the current sensor;
    a luminaire diagnostic program stored in a memory of the controller, wherein the luminaire diagnostic program is operative to:
        update a reference power value based upon an average real power computed using the received voltage information and the received current information;
        compute a current real power based upon the received voltage information and the received current information; and
        increment a cycling counter based upon determining, while the luminaire is associated with an ON state, that the current real power is less than a first threshold associated with the reference power value; and identify a cycling fault based upon the cycling counter exceeding a second threshold.

10. The intelligent luminaire manager of claim 9, wherein the first threshold is a predetermined percentage or fraction of the reference power value.

11. The intelligent luminaire manager of claim 9, wherein the average real power is computed within a predetermined time period range from the computation of the current real power.

12. The intelligent luminaire manager of claim 11, wherein the luminaire diagnostic program is operative to:
update the reference power value when the computed average real power exceeds an existing value of the reference power value.

13. The intelligent luminaire manager of claim 11, wherein an indication of the cycling fault is wirelessly transmitted to a network server via a network of networked intelligent luminaire managers.

\* \* \* \* \*